(12) United States Patent
Araki et al.

(10) Patent No.: US 7,919,434 B2
(45) Date of Patent: Apr. 5, 2011

(54) OXIDE SUPERCONDUCTING FILM AND METHOD OF PREPARING THE SAME

(75) Inventors: Takeshi Araki, Tokyo (JP); Koichi Nakao, Hachioji (JP); Izumi Hirabayashi, Tokyo (JP)

(73) Assignees: Kabushiki Kaisha Toshiba, Tokyo (JP); International Superconductivity Technology Center, Tokyo (JP)

( * ) Notice: Subject to any disclaimer, the term of this patent is extended or adjusted under 35 U.S.C. 154(b) by 0 days.

(21) Appl. No.: 12/764,638

(22) Filed: Apr. 21, 2010

(65) Prior Publication Data

US 2010/0204049 A1    Aug. 12, 2010

Related U.S. Application Data

(60) Division of application No. 12/550,445, filed on Aug. 31, 2009, now Pat. No. 7,732,376, which is a division of application No. 12/041,094, filed on Mar. 3, 2008, now Pat. No. 7,691,786, which is a division of application No. 11/354,970, filed on Feb. 16, 2006, now Pat. No. 7,361,627, which is a continuation of application No. PCT/JP2005/014367, filed on Jul. 29, 2005.

(30) Foreign Application Priority Data

Jul. 30, 2004 (JP) ................................. 2004-224890

(51) Int. Cl.
*H01B 12/00* (2006.01)
*H01L 39/12* (2006.01)

(52) U.S. Cl. ....................................................... 505/238

(58) Field of Classification Search .................. 505/123, 505/238

See application file for complete search history.

(56) References Cited

U.S. PATENT DOCUMENTS

| | | | | |
|---|---|---|---|---|
| 5,004,725 | A | * | 4/1991 | Ovshinsky et al. ........... 505/123 |
| 5,227,362 | A | * | 7/1993 | Ovshinsky et al. ........... 505/123 |
| 5,869,431 | A | | 2/1999 | Veal et al. |
| 6,256,521 | B1 | | 7/2001 | Lee et al. |
| 6,586,042 | B2 | | 7/2003 | Araki et al. |
| 6,821,930 | B2 | | 11/2004 | Araki et al. |
| 6,974,501 | B1 | | 12/2005 | Zhang et al. |
| 7,615,515 | B2 | | 11/2009 | Araki et al. |
| 2002/0139960 | A1 | | 10/2002 | Manabe et al. |
| 2003/0050195 | A1 | | 3/2003 | Wiesmann et al. |
| 2004/0192599 | A1 | | 9/2004 | Schuh et al. |

(Continued)

OTHER PUBLICATIONS

Vanderah et al "Synthesis and characterization of fluoride-substituted RBa2Cu3O7: R=Y, Eu, La", Mat. Res. Bul. 24(1) Jan. 1989, 121-129.*

(Continued)

*Primary Examiner* — Mark Kopec
(74) *Attorney, Agent, or Firm* — Oblon, Spivak, McClelland, Maier & Neustadt, L.L.P.

(57) ABSTRACT

The present invention relates to a method of preparing an oxide superconducting film, the method includes reacting a metal acetate containing metal M selected from the group consisting of lanthanum, neodymium and samarium with fluorocarboxylic acid having not less than three carbon atoms, reacting barium acetate with fluorocarboxylic acid having two carbon atoms, reacting copper acetate with fluorocarboxylic acid having not less than two carbon atoms, respectively, followed by refining reaction products, dissolving the reaction products in methanol such that a molar ratio of the metal M, barium and copper is 1:2:3 to prepare a coating solution, and coating a substrate with the coating solution to form a gel film, followed by calcining and firing the gel film to prepare an oxide superconducting film.

4 Claims, 18 Drawing Sheets

U.S. PATENT DOCUMENTS

2006/0240989 A1 10/2006 Bock et al.

OTHER PUBLICATIONS

Suryanarayanan et al "Preparation by sol-gel, structure and superconductivity of pure and fluorinated LaBa2Cu3O7-d", Physica C 361 (2001) 40-44.*

Masuda et al "Sol-gel synthesis and anomalies on magnetic and electric properties of (Ba1-x,Lax)3Cu3(O,F)y films", Journ. Mat. Res. 13(11) Nov. 1998, 3022-26.*

IBM Technical Disclosure Bulletin (vol. 32, No. 5B, Oct. 1989).

Honjo, et al., Physica C. 2001, vol. 357-360, pp. 999-1002.

Araki, et al., Supercond. Sci. Technol., 2003, vol. 16, pp. R74-R94.

Araki, et al., Cryogenics, 2001, vol. 41, pp. 675-681.

Araki, et al., Journal of Applied Physics, 2002, vol. 92, No. 6, pp. 3318-3325.

Araki, et al., Supercond. Sci. Technol., 2001, vol. 14, pp. L21-L24.

* cited by examiner

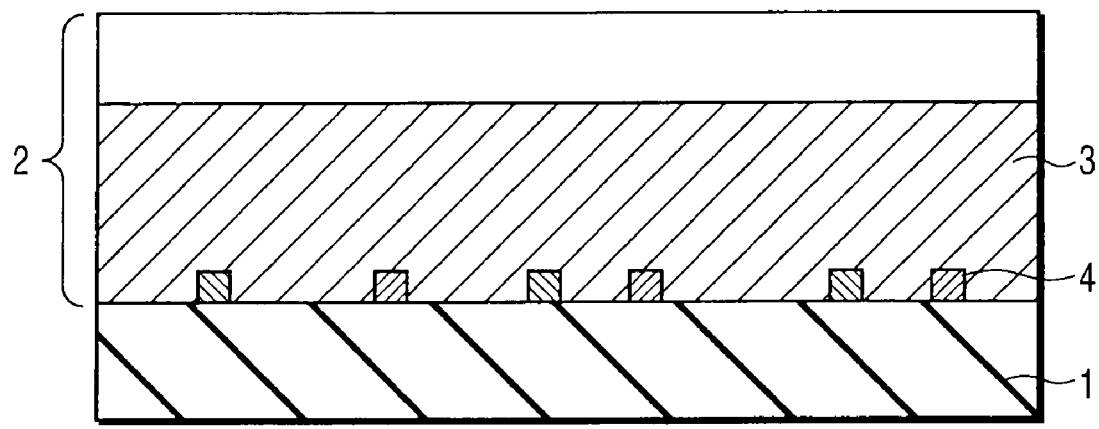
F I G. 5A
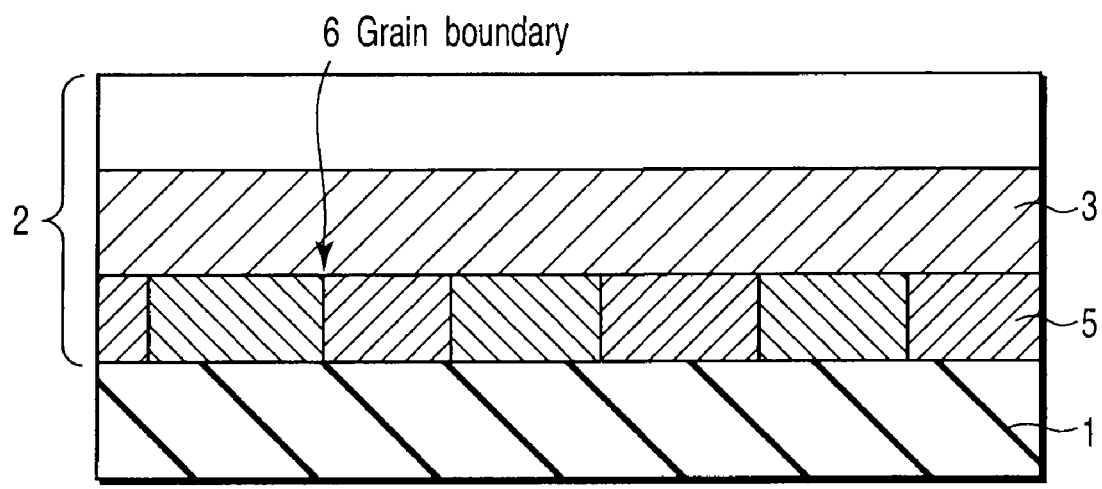
F I G. 5B

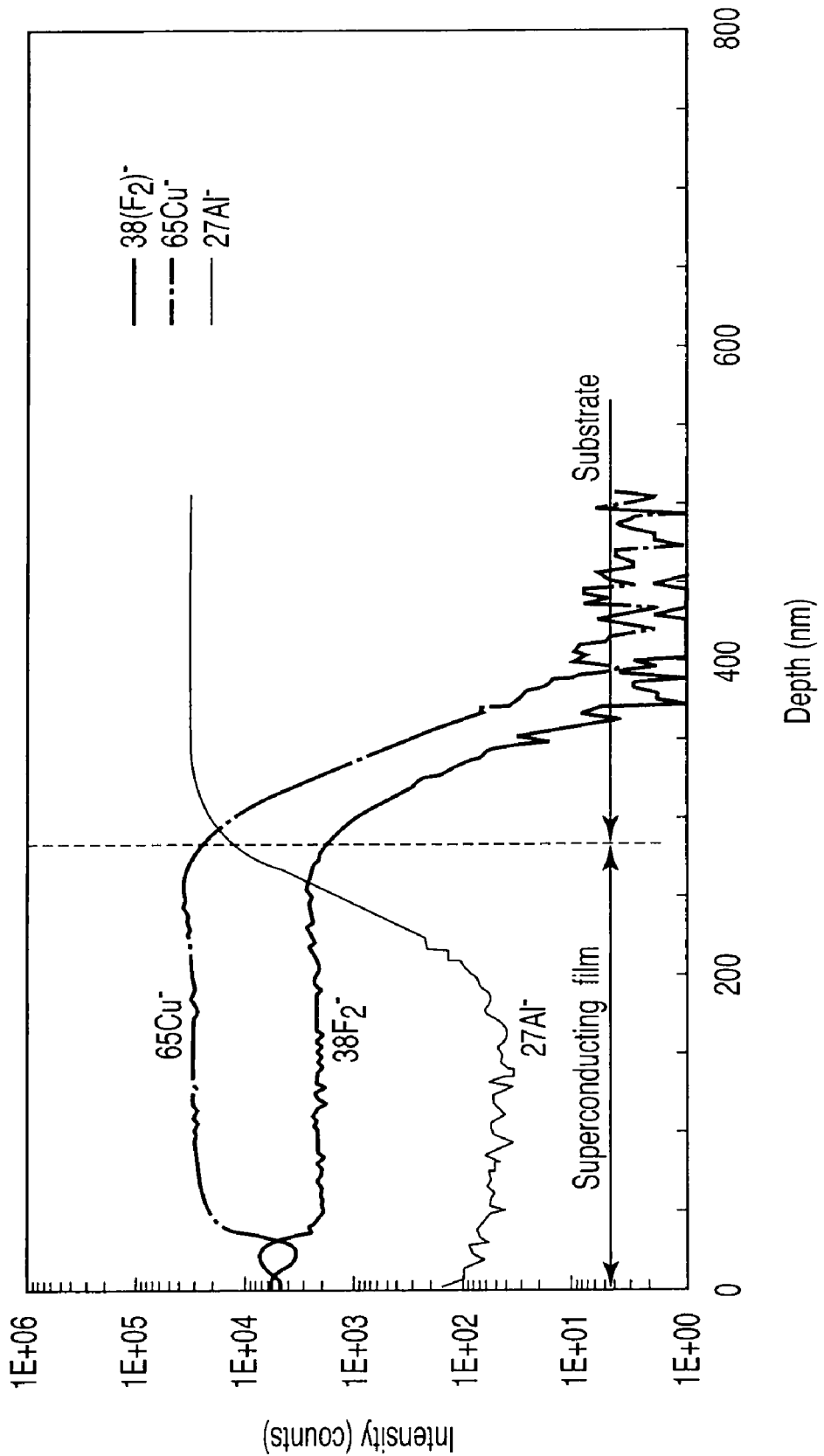
F I G. 6

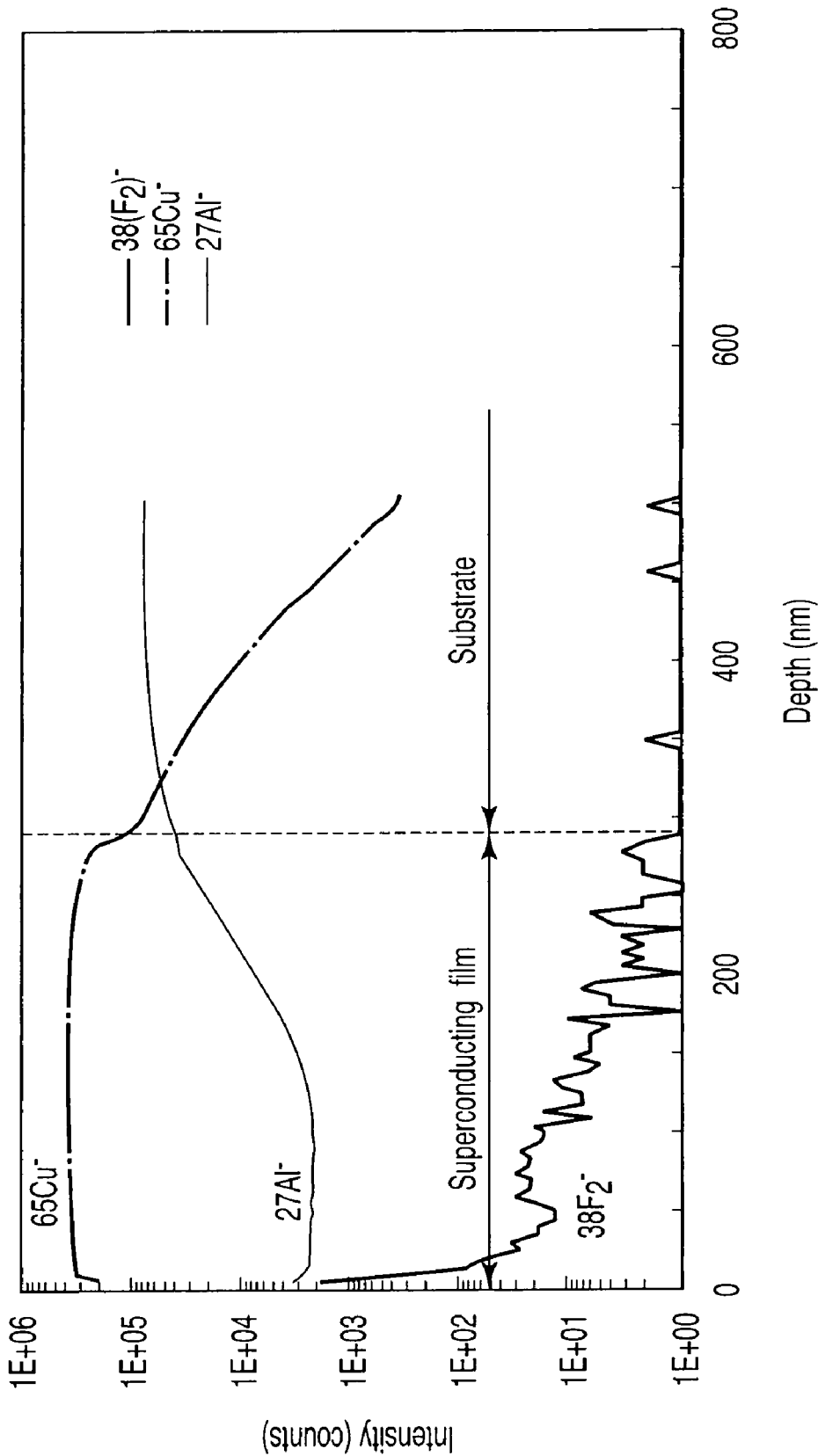
F I G. 7

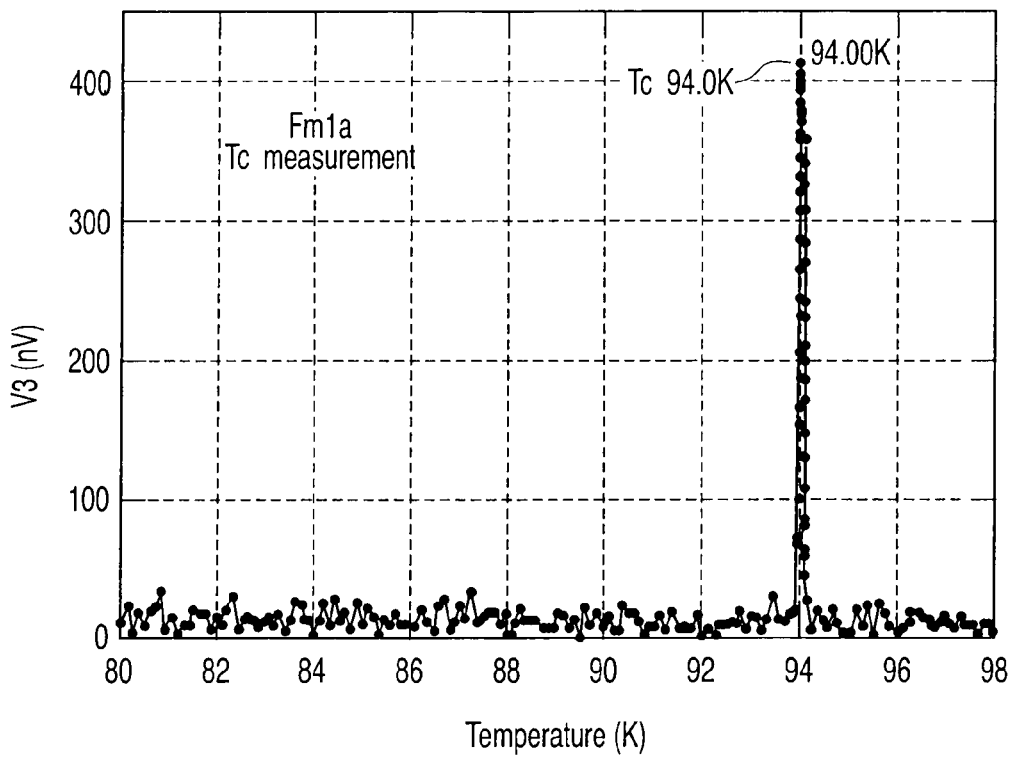
F I G. 14
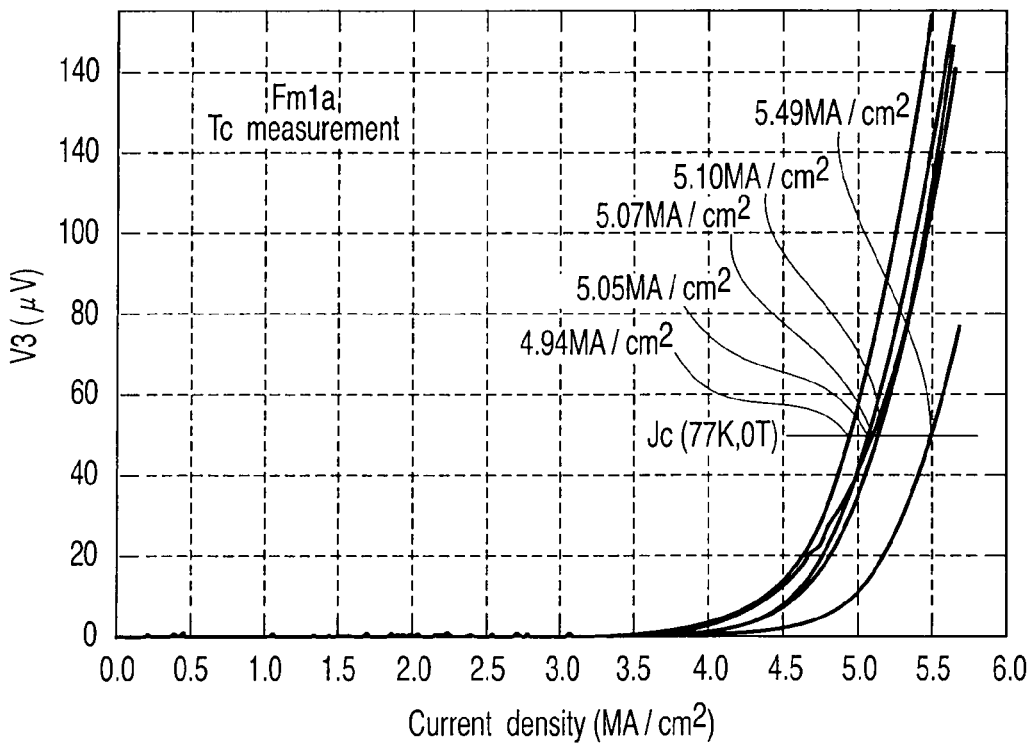
F I G. 15

OXIDE SUPERCONDUCTING FILM AND METHOD OF PREPARING THE SAME

CROSS-REFERENCE TO RELATED APPLICATIONS

This application is a divisional of U.S. application Ser. No. 12/550,445, filed on Aug. 31, 2009 (now U.S. Pat. No. 7,732,376), which is a divisional of U.S. application Ser. No. 12/041,094 (now U.S. Pat. No. 7,691,786), filed on Mar. 3, 2008, which is a divisional of U.S. application Ser. No. 11/354,970 (now U.S. Pat. No. 7,361,627), filed on Feb. 16, 2006, which is a Continuation Application of PCT Application No. PCT/JP2005/014367, filed Jul. 29, 2005, which was published under PCT Article 21(2) in Japanese.

This application is based upon and claims the benefit of priority from prior Japanese Patent Application No. 2004-224890, filed Jul. 30, 2004, the entire contents of which are incorporated herein by reference.

BACKGROUND OF THE INVENTION

1. Field of the Invention

The present invention relates to an oxide superconducting film and a method of preparing the same.

2. Description of the Related Art

High critical-current oxide superconducting materials which are recently beginning to be put into practical use are expected to be usefully applied to, e.g., a fusion reactor, a magnetically levitated train, a particle accelerator, and a magnetic resonance imaging apparatus (MRI), and some materials are already put into practical use. Y-based superconductors, and the Y-based superconductor having good magnetic characteristics is attracting a great deal of attention as a material which will be put into practical use in the near future.

Examples of a method of preparing a Y-based superconducting film are pulsed laser deposition (PLD), liquid phase epitaxy (LPE), electron beam (EB) processing, and metalorganic, deposition (MOD). Of these methods, non-vacuum, low-cost MOD is being spotlighted in recent years and extensively studied mainly in the United States of America and Japan. It is recently reported that among other MOD methods, MOD using trifluoroacetates (referred to as TFA-MOD hereinafter) can manufacture a superconducting film having good characteristics.

MOD is a method comprising: coating a single-crystal substrate with a chemical solution by spin coating or dip coating, followed by drying the chemical solution to form a gel film, and performing annealing processes twice under normal pressure for the gel film, i.e., calcining and firing, to prepare a superconducting film. In this method, an oxide is formed by decomposing organic materials contained in a precursor by calcining performed in a range of 400° C. to 500° C., and a biaxially oriented structure is formed in the oxide layer by firing performed in a range of 700° C. to 900° C.

MOD has a problem that crystallites are formed after calcining, a disordered oriented structure is formed from these crystallites during firing, and the influence of the phenomenon particularly increases when the thickness is 100 nm or more. To provide a highly oriented structure by this method, it is important to perform rapid heating and rapid cooling within a short period of time so that no crystallites are formed by crystal growth of the thermally decomposed oxide in the calcined film. The rapid heating and rapid cooling are performed by loading and unloading a sample into and from an electric furnace. However, it is difficult to form an even film because the degree of heating of the sample differs between on the central portion and on the edge portion. Therefore, this method requires a large electric furnace capable of precise temperature control. In addition, it is difficult to prepare a superconducting film having good characteristics with high reproducibility because there exist not a little different phases.

As a method that improves MOD described above by which crystallites in the calcined film exert no influence on the fired structure, TFA-MOD is developed. TFA-MOD was first reported by Gupta et al. in 1988. At that time, the purity of solutions was presumably low owing to the effect of starting materials, so TFA-MOD did not provide any particularly outstanding characteristics or reproducibility like other MOD methods. Afterwards, McIntyre et al. improved TFA-MOD, and a superconducting critical current density ($J_C$) exceeding 1 $MA/cm^2$ at 77K and 0 T was realized.

Although TFA-MOD is a type of MOD, crystallites in the calcined film exert no influence on orientation of the fired structure. TEM observation shows that a large number of nanocrystallites exist in the cross-section of the calcined film, but all these nanocrystallites disappear after firing, so a biaxially oriented structure is formed with high reproducibility (T. Araki and I. Hirabayashi, Supercond. Sci. Technol., 16, R71 (2003)). In TFA-MOD, therefore, unlike in normal MOD, carbon which is harmful to superconducting characteristics can be expelled almost completely by calcining continued over 10 hours or more, so a superconducting film having good characteristics can be prepared with high reproducibility (T. Araki, Cryogenics, 41, 675 (2002)). Initially, the growth mechanism during firing was unknown. However, it is recently found that a quasi-liquid network is formed due to mixing of fluorine, and this eliminates crystallites in the calcined film. This reveals in principle that TFA-MOD provides high reproducibility and good characteristics which cannot be realized by any normal MOD (T. Araki et al., J. Appl. Phys., 92, 3318 (2002)).

Unfortunately, TFA-MOD has a problem of difficulty in refining because trifluoroacetate solutions are used. This method finally requires a methanol solution, but trifluoroacetates as carboxylates cause esterification reaction with alcohol, i.e., methanol. If refining is performed in water in order to avoid esterification, hydrogen atoms in water molecules and fluorine atoms in trifluoroacetates form strong hydrogen bonds. Consequently, a large amount, i.e., about 12 wt %, of impurities remain. In a superconducting film prepared from a solution containing impurities, the value of $J_C$ is as low as less than 1 $MA/cm^2$ (77K, 0 T).

The solvent-into-gel (SIG) method can address this problem so as to prepare a high-purity solution (T. Araki et al., Supercond. Sci. Technol., 14, L21 (2001); U.S. Pat. No. 6,586,042). In refining of trifluoroacetates, water or alcohols must be used, so molecular trapping through hydrogen bonds is unavoidable. Under the circumstances, based on analysis of the trapping mechanism, it has been found that the SIG method can reduce the impurity amount to about 1/20. As a consequence, the characteristics of the superconducting film improved to $J_C$=7 $MA/cm^2$ (77K, 0 T). Also, 24 YBCO samples having various thicknesses were manufactured by using a high-purity solution prepared by the SIG method and performing optimum calcining in TFA-MOD. Measurement of the $J_C$ values of these samples revealed that all the samples had a $J_C$ value in a range of 5 to 7 $MA/cm^2$ (77K, 0 T). The very high reproducibility implied that a superconducting film was formed by a growth mechanism entirely different from the conventional one.

In the TFA-MOD method, organic materials are decomposed and, at the same time, a part of an oxide is converted into a fluoride in the first heat treatment (calcining), and a structure oriented on the atomic level is provided by the function of the fluoride in the second heat treatment (firing). Since the reaction is a chemical equilibrium reaction, a small amount of fluoride remains. SIMS analysis from the upper portion of the calcined film toward the substrate surface revealed that one tenth fluorine to Cu, in a molar ratio, remains in the film. SIMS analysis from the upper portion of the fired film toward the substrate surface revealed that about 1/100 to 1/1,000,000 fluorine to Cu, in a molar ratio, remains in the film. The closer the position to the surface is, the higher the fluorine concentration is. This is a phenomenon unique to a chemical equilibrium reaction.

By the use of the SIG method for preparing a high-purity solution described above, it has become possible to prepare high-purity solutions of many lanthanoide (Ln)-based superconductors in addition to Y-based superconductors ($YBa_2Cu_3O_{7-x}$), and to realize $J_C$ of 3 MA/cm$^2$ (77K, 0 T) for Gd-, Er-, Dy-, and Tm-based superconducting films. However, no good characteristics can be realized for La-, Nd-, and Sm-based superconducting films (having $T_C$ values of 100K, 96K, and 94K, respectively, in the bulk), although they are practically important. This is because an esterification reaction occurs under the initial conditions of solution synthesis. A Sm-based superconducting film prepared by solution synthesis under a conditional range over which no esterification reaction occurred exhibited $T_C$ of 84K at the best (U.S. Pat. No. 6,586,042 described above).

The esterification reaction described above is closely related to the atomic radii of lanthanide elements. There is a tendency that the smaller the atomic number of a lanthanide element is, the larger the atomic radius is. If the atomic radius of the central metal element of a trifluoroacetate is large, alcohol readily approaches the central metal element to allow easy occurrence of the esterification reaction. Accordingly, compared to Gd-, Er-, Dy-, and Tm-based materials, La-, Nd-, and Sm-based materials increase the possibility that alcohol approaches the central metal even though the atomic radius increases only slightly, so the esterification reaction readily occurs.

To suppress the esterification reaction, it is presumably effective to increase the molecular weight of carboxylate or alcohol. This is so probably because if high-molecular-weight carboxylate or alcohol is used, the esterification reaction conditions shift to higher temperatures or lower pressures, and as a consequence the esterification reaction can be suppressed.

However, to increase the molecular weight of carboxylate for suppressing the esterification reaction would increase the possibility that carbon remains in the film during calcining and deteriorates the superconducting characteristics. Also, when the SIG method was introduced to TFA-MOD, a mechanism by which carbon atoms harmful to the superconducting characteristics were expelled outside was unknown. Therefore, all the experiments using carboxylates having long chains provided significantly deteriorated characteristics.

On the other hand, it was assumed that alcohol did not increase the residual carbon amount because alcohol was used as a solvent and volatilized during coating. It has been tried to suppress the esterification reaction by using substitute solvents such as ethanol, 1-propanol, 2-propanol, and 1-butanol, instead of methanol. When ethanol was used, it was possible to suppress the esterification reaction and prepare high-purity ethanol solutions for all of La-, Nd-, and Sm-based materials. Similarly, the esterification reaction was suppressed when alcohols having larger molecular weights were used. However, when a Sm- or Y-based superconducting film was manufactured by preparing an ethanol solution, propanol solution, or butanol solution, coating the solution to form a gel film, and calcining and firing the gel film, the characteristics of the resultant superconducting film were significantly deteriorated. This is presumably because ethanol, propanol or butanol is inferior to methanol in volatility, so that a slight amount of alcohol remains in the gel film during coating, and this residual alcohol leaves residual carbon during firing, which deteriorates the superconducting characteristics.

Of La-, Nd-, and Sm-based superconducting films prepared by the method of suppressing esterification by using ethanol, only the Sm-based superconducting film exhibited superconductivity at a liquid nitrogen temperature, specifically, $T_C$ of 88.4K and $J_C$ of 0.60 MA/cm$^2$ (77K, 0 T). Even in this example, however, $T_C$ was much smaller than $T_C$=94K of a bulk Sm-based superconductor, and was also smaller than $T_C$=91K of a bulk Y-based superconductor. Accordingly, even this superconducting film was unsatisfactory to be put into practical use.

BRIEF SUMMARY OF THE INVENTION

A method of preparing an oxide superconducting film according to an aspect of the present invention comprises: reacting a metal acetate containing metal M selected from the group consisting of lanthanum, neodymium and samarium with fluorocarboxylic acid having not less than three carbon atoms, reacting barium acetate with fluorocarboxylic acid having two carbon atoms, and reacting copper acetate with fluorocarboxylic acid having not less than two carbon atoms, respectively, followed by refining reaction products; dissolving the reaction products in methanol such that a molar ratio of the metal M, barium and copper is 1:2:3 to prepare a coating solution; and coating a substrate with the coating solution to form a gel film, followed by calcining and firing the gel film to prepare an oxide superconducting film.

An oxide superconductor formed as a film on a substrate according to another aspect of the present invention comprises a main component represented by $SmBa_2Cu_3O_{7-x}$, and fluorine at a molar ratio of $10^{-2}$ to $10^{-6}$ with respect to copper, wherein a ratio of intensity of a/b-axis-oriented grains with respect to the total intensity of a/b-axis-oriented grains and c-axis-oriented grains observed by X-ray diffraction is not more than 15%.

An oxide superconductor formed as a film on a substrate according to yet another aspect of the present invention comprises a main component represented by $NdBa_2Cu_3O_{7-x}$, and fluorine at a molar ratio of $10^{-2}$ to $10^{-6}$ with respect to copper, wherein a ratio of intensity of a/b-axis-oriented grains with respect to the total intensity of a/b-axis-oriented grains and c-axis-oriented grains observed by X-ray diffraction is not more than 50%.

An oxide superconductor formed as a film on a substrate according to still another aspect of the present invention comprises a main component represented by $LaBa_2Cu_3O_{7-x}$, and fluorine at a molar ratio of $10^{-2}$ to $10^{-6}$ with respect to copper.

Each of the above oxide superconductors is suitably used for a superconducting filter device.

BRIEF DESCRIPTION OF THE SEVERAL
VIEWS OF THE DRAWING

FIGS. 5A and 5B are views showing a crystal growth mechanism in the embodiment of the present invention;

FIG. 6 is a graph showing the results of SIMS analysis on calcined films in Example 1;

FIG. 7 is a graph showing the results of SIMS analysis on sample Fm1a in Example 1;

FIG. 14 is a graph showing $T_C$ measurement data of a Sm-based superconducting film manufactured in Example 1;

FIG. 15 is a graph showing $J_C$ measurement data of a Sm-based superconducting film manufactured in Example 1;

DETAILED DESCRIPTION OF THE INVENTION

An embodiment of the present invention will be described below.

In a method according to the embodiment of the present invention, an oxide superconducting film is manufactured by the procedures described below.

Figure 1:
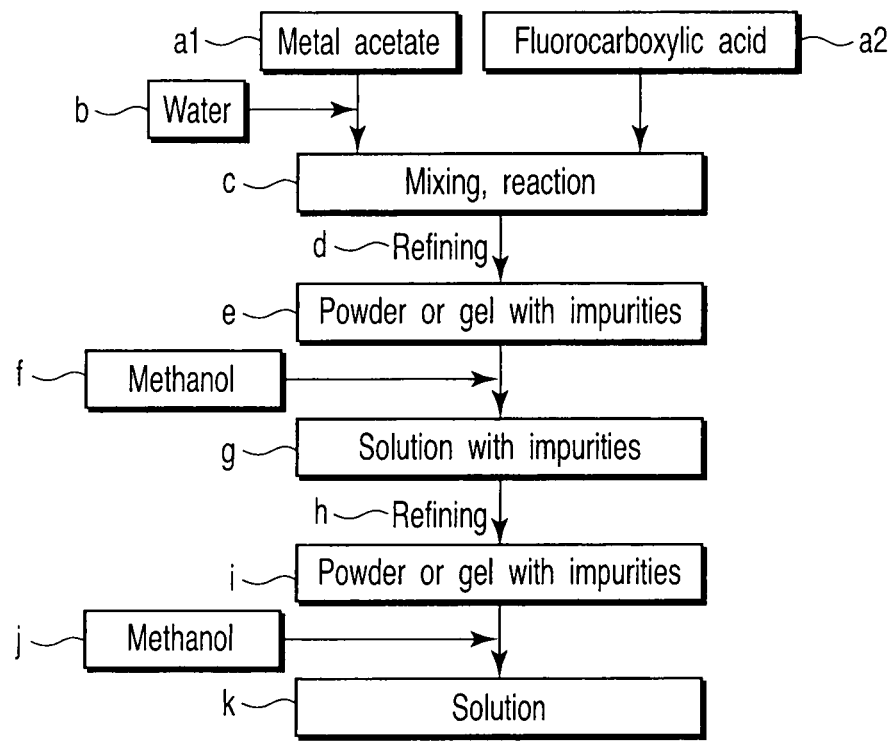
FIG. 1 is a flowchart for preparing a coating solution in an embodiment of the present invention.

First, a process of reacting a metal acetate with a fluorocarboxylic acid and refining the reaction product will be described with reference to FIG. 1. Referring to FIG. 1, the metal acetate a1 is used as a general term of a metal acetate containing metal M, a barium acetate, and a copper acetate. An appropriate fluorocarboxylic acid is used in accordance with the metal acetate. That is, a metal acetate containing metal M selected from the group consisting of lanthanum, neodymium and samarium is reacted with a fluorocarboxylic acid having three or more carbon atoms, e.g., pentafluoropropionic acid (PFP). In addition, barium acetate is reacted with a fluorocarboxylic acid having two carbon atoms, e.g., trifluoroacetic acid (TFA). Also, copper acetate is reacted with a fluorocarboxylic acid having two or more carbon atoms, e.g., trifluoroacetic acid (TFA) or pentafluoropropionic acid (PFP). Barium acetate must be reacted with a fluorocarboxylic acid having two carbon atoms because a precipitate is produced if barium acetate is reacted with a fluorocarboxylic acid having three or more carbon atoms. When both barium acetate and copper acetate are to be reacted with TFA, it is possible to mix powders of barium acetate and copper acetate at a desired ratio in advance and then react the mixture with TFA. These reactions produce metal fluorocarboxylates.

The fluorocarboxylic acid having three or more carbon atoms is not limited to pentafluoropropionic acid (PFP), and it is also possible to use heptafluorobutanoic acid (HFB) or nonafluorpentanoic acid (NFP). The fluorocarboxylic acid having two carbon atoms is not limited to trifluoroacetic acid (TFA), and it is also possible to use monofluoroacetic acid (MFA) or difluoroacetic acid (DFA).

After the metal acetate containing metal M is reacted with fluorocarboxylic acid having three or more carbon atoms, a fluorocarboxylic acid group having three or more carbon atoms, e.g., a pentafluoropropionic acid group of the reaction product may also be substituted with a fluorocarboxylic acid group having fewer carbon atoms, e.g., a trifluoroacetic acid group.

After the above reactions, a reaction product (referred to as a "reaction product A" hereinafter) obtained by reacting a metal acetate containing metal M with fluorocarboxylic acid having three or more carbon atoms, a reaction product (referred to as a "reaction product B" hereinafter) obtained by reacting barium acetate with fluorocarboxylic acid having two carbon atoms, and a reaction product (referred to as a "reaction product C" hereinafter) obtained by reacting copper acetate with fluorocarboxylic acid having two or more carbon atoms are refined. For the refining, the SIG (solvent-into-gel) method is preferably used. The SIG method comprises adding methanol to gel for replacing impurities (e.g., water) with methanol, and then volatilizing the methanol and impurities for refining to prepare powder or gel. A solution is prepared by dissolving the powder or gel in methanol again.

Figure 2:
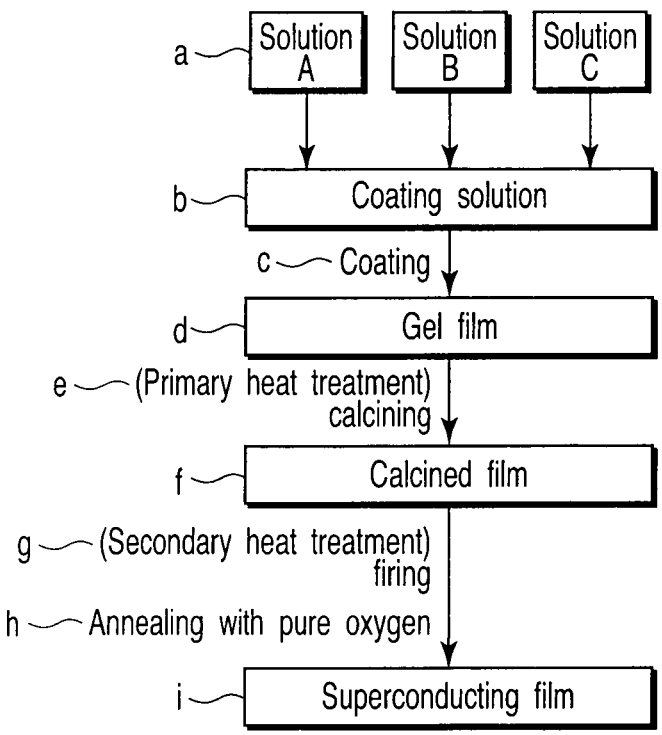
FIG. 2 is a flowchart for preparing a superconducting film in the embodiment of the present invention.

A process of preparing a coating solution, forming a gel film by coating a substrate with the coating solution, and providing an oxide superconducting film through calcining and firing will be described below with reference to FIG. 2. Referring to FIG. 2, the solution A is prepared by refining the reaction product A by the SIG method and contains metal M, the solution B is prepared by refining the reaction product B by the SIG method and contains barium, and the solution C is prepared by refining the reaction product C by the SIG method and contains copper. A coating solution is prepared by dissolving the solutions A, B, and C in methanol such that the molar ratio of metal M, barium, and copper is set to 1:2:3. A gel film is formed by coating a substrate with this coating solution. After that, an oxide superconducting film is prepared by performing calcining (a primary heat treatment), firing (a secondary heat treatment), and oxygen annealing.

Figure 3:
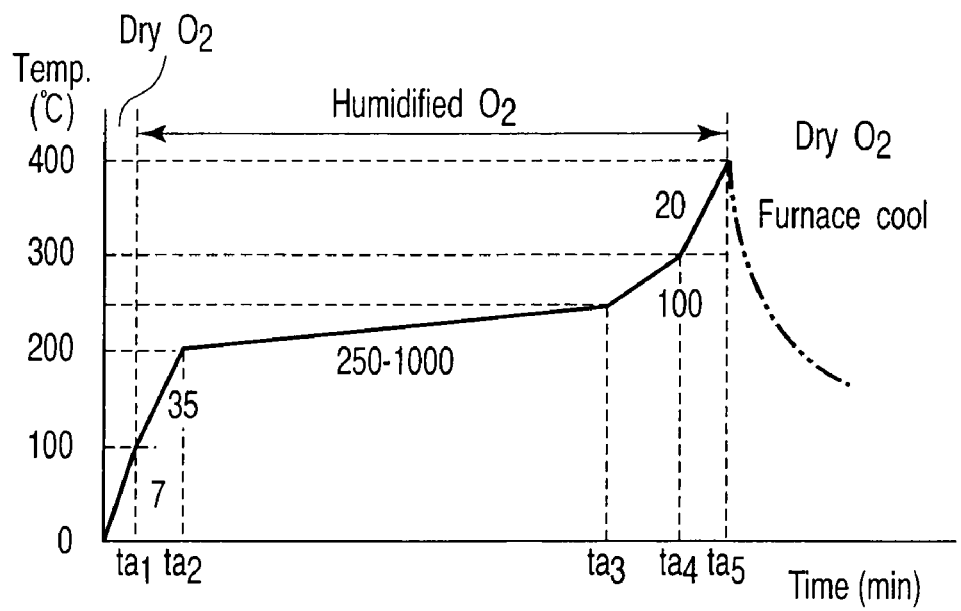
FIG. 3 is a graph showing a temperature profile during calcining in the embodiment of the present invention.

The formed gel film is calcined in an electric furnace to form a calcined film made of a metal oxyfluoride. FIG. 3 shows an example of a temperature profile (and atmosphere) during calcining.

(1) From time 0 to time $t_{a1}$ (about 7 minutes from the start of the heat treatment), the temperature inside a heat treating furnace is abruptly raised from room temperature to 100° C. The interior of the heat treating furnace is placed in a dry oxygen atmosphere under normal pressure. Note that all subsequent heat treatment steps can be performed under normal pressure.

(2) At time $t_{a1}$, the atmosphere in the heat treating furnace is changed to humidified oxygen atmosphere under normal pressure. From time $t_{a1}$ to time $t_{a2}$ (about 42 minutes from the start of the heat treatment), the temperature inside the heat treating furnace is raised from 100° C. to 200° C. In this state, the humidified oxygen atmosphere is set within the humidity range of 1.2% to 12.1%. The humidity range corresponds to a dew point range of 10° C. to 50° C. To adjust the humidity, bubbles of an atmosphere gas (oxygen gas) are passed through water at a predetermined temperature. That is, the humidity is determined by the saturated vapor pressure in bubbles when they pass through water. The saturated vapor pressure is determined by the temperature. To set the dew point temperature corresponding to the humidity to be lower than room temperature, the atmosphere gas is divided to pass bubbles of only a portion of the gas through water, and then the divided gases are mixed. The main purpose of the humidification is to prevent sublimation of copper fluoroacetate which sublimes most easily, by partially hydrolyzing the copper fluoroacetate into an oligomer so as to increase an apparent molecular weight. In the case where the fluoroacetic acid is trifluoroacetic acid, hydrolysis is performed as follows. Since F and H atoms at the two ends of the copper salt form hydrogen bonds by which four to five molecules are combined, the apparent molecular weight increases and sublimation thereof is suppressed.

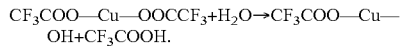

$CF_3COO-Cu-OOCCF_3+H_2O \rightarrow CF_3COO-Cu-OH+CF_3COOH$.

(3) From time $t_{a2}$ to time $t_{a1}$ (about 4 hours and 10 minutes to 16 hours and 40 minutes), the temperature inside the furnace is gradually raised from 200° C. to 250° C. The temperature is thus gradually raised in order to prevent the partially hydrolyzed salt from combusting by an abrupt reaction to leave carbon components behind. The long-time hydrolysis cleaves the covalent bonds of the salt by which metal oxides ($Y_2O_3$, BaO, and CuO) are formed temporarily. For Y and Ba oxides, oxygen is substituted by fluorine to produce a compound containing oxygen and fluorine at an indeterminate ratio, as described in T. Araki and I. Hirabayashi, Supercond. Sci. Technol., 16, R71 (2003). Since the reaction gradually advances in this state and the temperature is held, only CuO as a single substance causes grain growth to form nanocrystallites of a few tens of nm. Y and Ba components with an indeterminate ratio of fluorine and oxygen cannot cause grain growth and become amorphous.

(4) From time $t_{a3}$ to time $t_{a4}$ and from time $t_{a4}$ to time $t_{a5}$ (about 2 hours), the temperature inside the heat treating furnace is raised from 250° C. to 400° C. Unnecessary organic materials decomposed during the time $t_{a2}$ to $t_{a3}$ remain through a hydrogen bond or the like in the film. In this step, these unnecessary organic materials are removed by heating.

(5) After time $t_{a5}$, furnace cool is performed while a gas is supplied. The obtained calcined film is subjected to firing and oxygen annealing in an electric furnace into a superconducting film.

Figure 4:
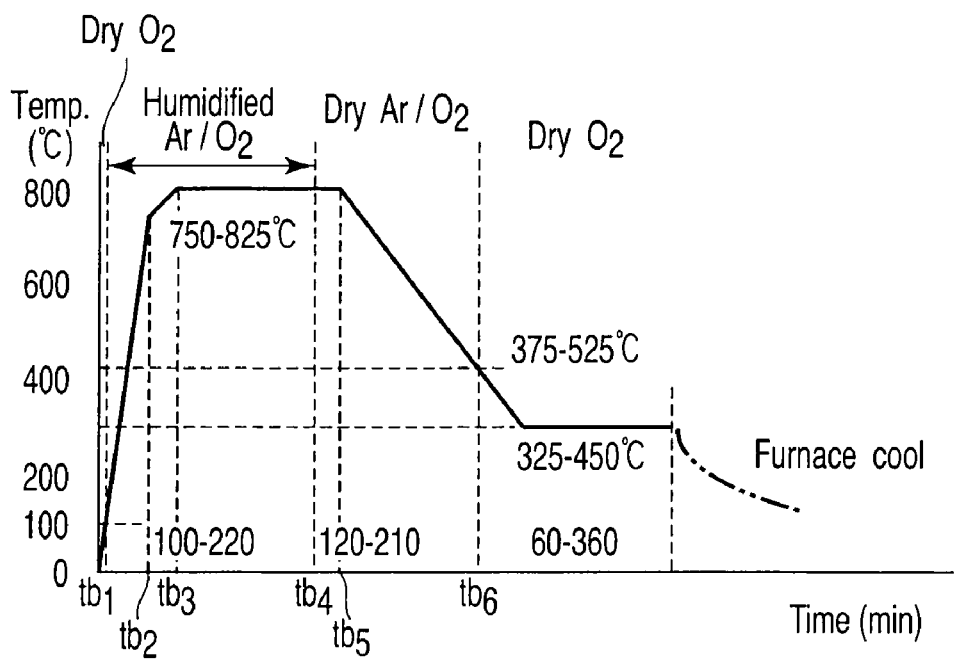
FIG. 4 is a graph showing a temperature profile during firing in the embodiment of the present invention.

FIG. 4 shows an example of a temperature profile (and atmospheres) during firing.

(6) From time 0 to time $t_{b1}$ (about 7 minutes from the start of the heat treatment), the temperature inside the heat treating furnace is abruptly raised from room temperature to 100° C. In this case, the interior of the heat treating furnace is place in an oxygen-mixed argon gas atmosphere under normal pressure. An optimum oxygen concentration is determined by a metal type of superconductor to be fired or firing temperature. Conventionally, in the case of firing a gel into Y-based superconducting film ($YBa_2Cu_3O_{7-x}$), optimal conditions are such that setting the oxygen partial pressure to 1,000 ppm at 800° C., and then reducing the oxygen concentration to approximately half every temperature lowering of 25° C. For La-, Nd-, and Sm-based superconducting films, reducing the oxygen concentration to approximately half every temperature lowering of 25° C. is also preferable. However, the oxygen partial pressures at 800° C. are set to 1 ppm, 5 ppm, and 20 ppm, respectively. Note that all subsequent heat treatment steps can be performed under normal pressure.

(7) From time $t_{b1}$ to time $t_{b2}$ (about 33 to 37 minutes, the temperature is raised to the maximum temperature at a rate of 20° C. per minute) and from time $t_{b2}$ to time $t_{b3}$ (about 5 minutes), the temperature inside the heat treating furnace is raised to the maximum temperature of 750° C. to 825° C. At time $t_{b1}$, the dry gas is humidified by the same method as in calcining. The humidification amount can be selected from 1.2% (dew point of 10° C.) to 30.7% (dew point of 70° C.), i.e., the humidifying temperature can be selected from a wide range. When the humidification amount is increased, the reaction rate is increased. The increase in reaction rate is estimated to be equal to the humidification amount to the one-half power (details are described in T. Araki and I. Hirabayashi, Supercond. Sci. Technol., 16, R71 (2003)). The heating rate is decreased from $t_{b2}$ to $t_{b3}$ in order to decrease the excess rise of the electric furnace temperature at $t_{b3}$. At a temperature of about 650° C., the formation of a quasi liquid phase is started inside the film by vapor, and a quasi-liquid network is formed inside the film (T. Araki et al., J. Appl. Phys., 92, 3318 (2002)).

(8) From time $t_{b3}$ to time $t_{b4}$ (about 45 minutes to 3 hours and 40 minutes: This time depends on the highest temperature and final thickness. The lower the temperature and the larger the thickness is, the longer the time is), $MBa_2Cu_3O_6$ (M=La, Nd, or Sm) is sequentially formed on the substrate from the quasi-liquid network, and at the same time HF gas and the like are discharged. Simplified chemical reactions are described as follows.

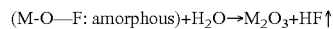

(M—O—F: amorphous)+$H_2O \rightarrow M_2O_3$+HF↑

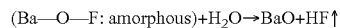

(Ba—O—F: amorphous)+$H_2O \rightarrow$ BaO+HF↑

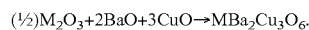

(½)$M_2O_3$+2BaO+3CuO$\rightarrow MBa_2Cu_3O_6$.

(9) From time $t_{b4}$, the gas is switched to a dry gas. This is because the oxide $MBa_2CuO_6$ formed until $t_{b4}$ is stable to water vapor at high temperatures near 800° C. but decomposed by water vapor at around 600° C.

(10) From time $t_{b4}$ to time $t_{b5}$ (about 10 minutes) and from time $t_{b5}$ to $t_{b6}$ (about 2 hours to 3 hours and 30 minutes), the temperature inside the heat treating furnace is kept lowered. During this cooling, the formed oxide remains unchanged.

(11) At time $t_{b6}$, the oxygen-mixed argon gas is switched to dry oxygen gas. By this oxygen annealing, $MBa_2Cu_3O_6$ is turned into $MBa_2Cu_3O_{7-x}$ (x=0.07), a superconducting film. The temperature for switching to oxygen depends on the metal M. The temperature was 525° C. for conventional Y. On the other hand, it has been found that excellent superconducting films can be prepared by setting the particular temperature between 425° C., and 525° C. for Sm, between 375° C. and 475° C. for Nd, and between 325° C. and 425° C. for La, respectively.

The mechanism of growth of superconducting crystal grains during firing will be described below with reference to FIGS. 5A and 5B. FIG. 5A shows the initial stage of growth, and FIG. 5B shows the intermediate stage of growth. In the initial stage of growth shown in FIG. 5A, nuclei 4 of superconducting grains are evenly produced in a superconductor precursor 3 constituting a calcined film 2 formed on a substrate 1. In the intermediate stage of growth shown in FIG. 5B, crystals 5 grow from the nuclei 4 in a lateral direction by which grain boundaries 6 are formed in places where adjacent crystals 5 come across with each other.

In the superconductor grown based on the mechanism, grain boundaries are regularly arranged every 5 to 50 nm in places where crystallites come across with each other. The interval of the grain boundaries seems to vary from 5 to 50 nm in accordance with the annealing conditions in firing. The periodic grain-boundary formation within the microscopic region is effective to trap magnetic fluxes, and presumably improves both the characteristics and reproducibility of the superconductor manufactured by the method of the present invention. Actually, a current of about 200 A is observed between the two ends of a wire in 10-m class at high reproducibility.

Incidentally, factors to deteriorate the superconducting characteristics include decrease in the ratio of c-axis-oriented grains resulting from the heat treatment conditions or the impurities in the solution, besides the direct influence from the residual carbon. In Sm-, Nd-, and La-based superconductors, as in a Y-based superconductor, c-axis-oriented grains are formed on the substrate surface which makes it possible to conduct a superconducting current in a direction parallel to the substrate plane. However, since the a-axis length and b-axis length are substantially equal and is substantially ⅓ the c-axis length, a/b-axis-oriented grain, which has such a structure that the c-axis-oriented grain is fallen down sideways, is easily formed. When this structure is formed, an electric current flows only in a direction perpendicular to the substrate plane, bringing about deterioration in the superconducting characteristics due to cutoff of the superconducting current in the direction parallel to the substrate plane. In addition, the growth rate of the c-axis-oriented grains in the direction parallel to the substrate plane is regarded as nearly 100 times that in the stacking direction. That is, the a/b-axis-oriented grains rapidly grow in the direction perpendicular to the substrate plane which would also be a factor to deteriorate the superconducting characteristics.

The nucleation probabilities for the c-axis-oriented grains and for the a/b-axis-oriented grains are presumably determined by the matching with the lattice constant of the substrate surface. It is also possible to maximize the probability of formation of c-axis-oriented grains by selecting the heat treatment conditions (oxygen partial pressure and firing temperature). However, it is found that even under conditions by which the c-axis-oriented grains are easily formed, the a/b-axis-oriented grains are formed, bringing about deterioration in the superconducting characteristics. A thick Y-based superconducting film manufactured from a solution prepared without use of the SIG method exhibits particularly deteriorated characteristics. The structure of the a/b-axis-oriented grains grows to the vicinity of the surface by nucleation. In a thick film, the generation rate of the a/b-axis-oriented grains per unit area is increased, which readily deteriorates the superconducting characteristics. On the other hand, when a Y-based superconducting film is manufactured by TFA-MOD using a high-purity solution prepared by the SIG method, the influence of the a/b-axis-oriented grains is low, and a high $J_C$ value is provided with high reproducibility as described previously.

In the present invention as well, the influence of the a/b-axis-oriented grains can be reduced by using a high-purity solution prepared by the SIG method.

More specifically, the oxide superconducting film according to the embodiment of the present invention can be defined as follows. That is, the oxide superconductor formed as a film on a substrate contains a main component represented by $MBa_2Cu_3O_{7-x}$ (where M is a metal selected from the group consisting of lanthanum, neodymium and samarium), and also contains fluorine at a molar ratio of $10^{-2}$ to $10^{-6}$ with respect to copper. The "film" means herein a material formed to have a thickness of 10 μm or less. Letting $I_c$ be the intensity of c-axis-oriented grains and $I_{ab}$ be the intensity of a/b-axis-oriented grains, the ratio $r_{ab}$ of the a/b-axis-oriented grains is defined as $r_{ab}=I_{ab}/(I_c+I_{ab})$. In the oxide superconducting film according to the embodiment of the present invention, $r_{ab}$ is 15% or less when M is Sm, 50% or less when M is Nd, and is not limited when M is La, respectively. The film also has a structure that a ratio of a biaxially oriented layer at the interface between the substrate and the $SmBa_2Cu_3O_{7-x}$ film is not less than 95%, and a ratio of a biaxially oriented layer in a surface portion of the film is not more than 80% based on transmission electron microscope (TEM) observation on a cross-section perpendicular to the substrate plane. The film also has a structure that grain boundaries having a bonding angle of about 0.2° to 1° are regularly arranged every 5 to 50 nm based on transmission electron microscope (TEM) observation on a plane parallel to the substrate and apart by 50 nm from the substrate in a direction perpendicular to the substrate.

EXAMPLES

Examples of the present invention will be described below.

Example 1

Powder of about 3.8 hydrate of $(CH_3COO)_3Sm$ was dissolved in ion-exchange water. The solution and an equimolar amount of $CF_3CF_2COOH$ (PFP) were mixed and stirred in an eggplant type flask. The mixture was then reacted and refined under reduced pressure for about 10 hours with a rotary evaporator to prepare semitransparent light-yellow powder SL1app (e in FIG. 1). The powder SL1app was completely dissolved by adding methanol equivalent to a weight about 100 times thereof to prepare a yellow solution. The solution was refined again under reduced pressure for about 12 hours with a rotary evaporator to prepare opaque light-yellow powder SL1ap (i in FIG. 1). The powder SL1ap was dissolved in methanol again and diluted in a measuring flask to prepare a solution SL1a with a concentration of 0.78 mol/L in terms of metal ions (k in FIG. 1).

Powder of anhydrous $(CH_3COO)_2Ba$ was dissolved in ion-exchange water, and powder of about 1.0 hydrate of $(CH_3COO)_2Cu$ was also dissolved in ion-exchange water, respectively. These solutions and equimolar amounts of $CF_3COOH$ (TFA) were mixed and stirred in beakers, respectively. The two solutions were mixed in an eggplant type flask such that the molar ratio of metal ion was set to 2.00:3.00 to prepare a dark-blue solution. The solution was reacted and refined under reduced pressure for about 10 hours with a rotary evaporator to prepare a semitransparent blue gel SL1bcpp (e in FIG. 1). The gel SL1bcpp was completely dissolved by adding methanol equivalent to a weight about 100 times thereof to prepare a blue solution. The solution was refined again under reduced pressure for about 12 hours with a rotary evaporator to prepare a blue gel SL1bcp (i in FIG. 1). The gel SL1bcp was dissolved in methanol again and diluted in a measuring flask to prepare a solution SL1bc with a concentration of 1.50 mol/L in terms of metal ions (k in FIG. 1).

The solutions SL1a and SL1bc were mixed such that the molar ratio of Sm:Ba:Cu was set to 1.00:2.00:3.00 to prepare a coating solution SL1 (b in FIG. 2). The concentration of the coating solution was about 1.30 mol/L in terms of metal ions.

A (100) LaAlO$_3$ single-crystal substrate was spin-coated with the coating solution SL1 for an acceleration time of 0.2 sec, at a rotating speed of 2,000 rpm, and for a holding time of 150 sec (c in FIG. 2).

As shown in FIG. 4, calcining was performed under a 4.2% humidified oxygen atmosphere by setting the time from 200° C. to 250° C. to 11 hours and 43 minutes (703 minutes). FIG. 6 shows the results of SIMS analysis performed on one calcined film thus obtained. As shown in FIG. 6, the molar ratio of fluorine to copper was about 1/10.

Then, as shown in FIG. 5, firing was performed at 800° C. under a 4.2% humidified oxygen-mixed argon atmosphere (the oxygen partial pressure was set to 20, 50, 100, or 200 ppm), and annealing was performed with lowering the temperature under a dry oxygen-mixed argon atmosphere and then at 425° C. or less under a dry oxygen atmosphere to prepare Sm-based superconducting films (I in FIG. 2). The resultant Sm-based superconducting films were named as follows in accordance with the oxygen partial pressure in the humidified Ar/O$_2$ during firing.

| 20 ppm | 50 ppm | 100 ppm | 200 ppm |
| --- | --- | --- | --- |
| Fm1a | Fm1b | Fm1c | Fm1d |

Figure 8:
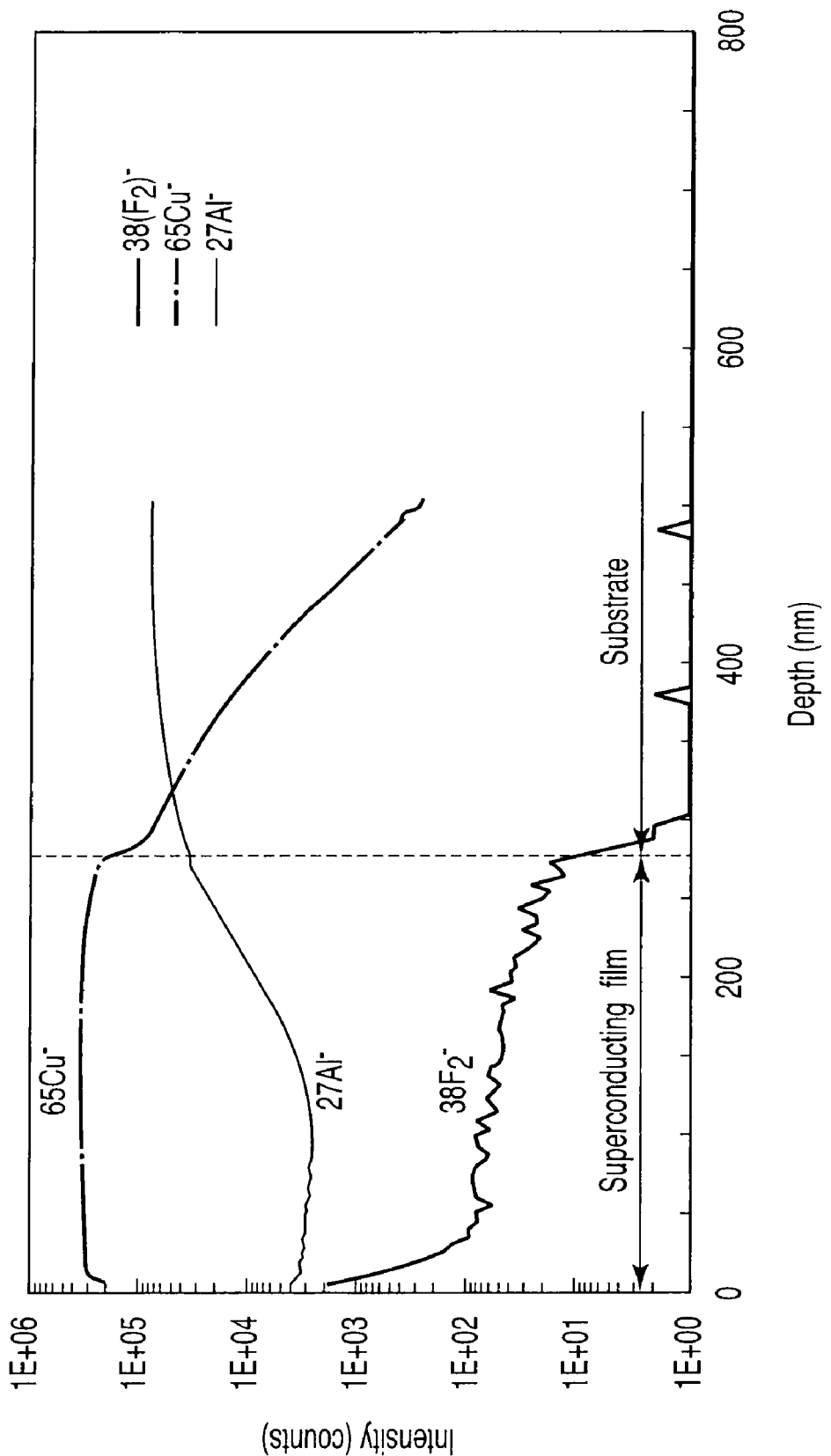
FIG. 8 is a graph showing the results of SIMS analysis on sample Fm1d in Example 1.
Figure 9:
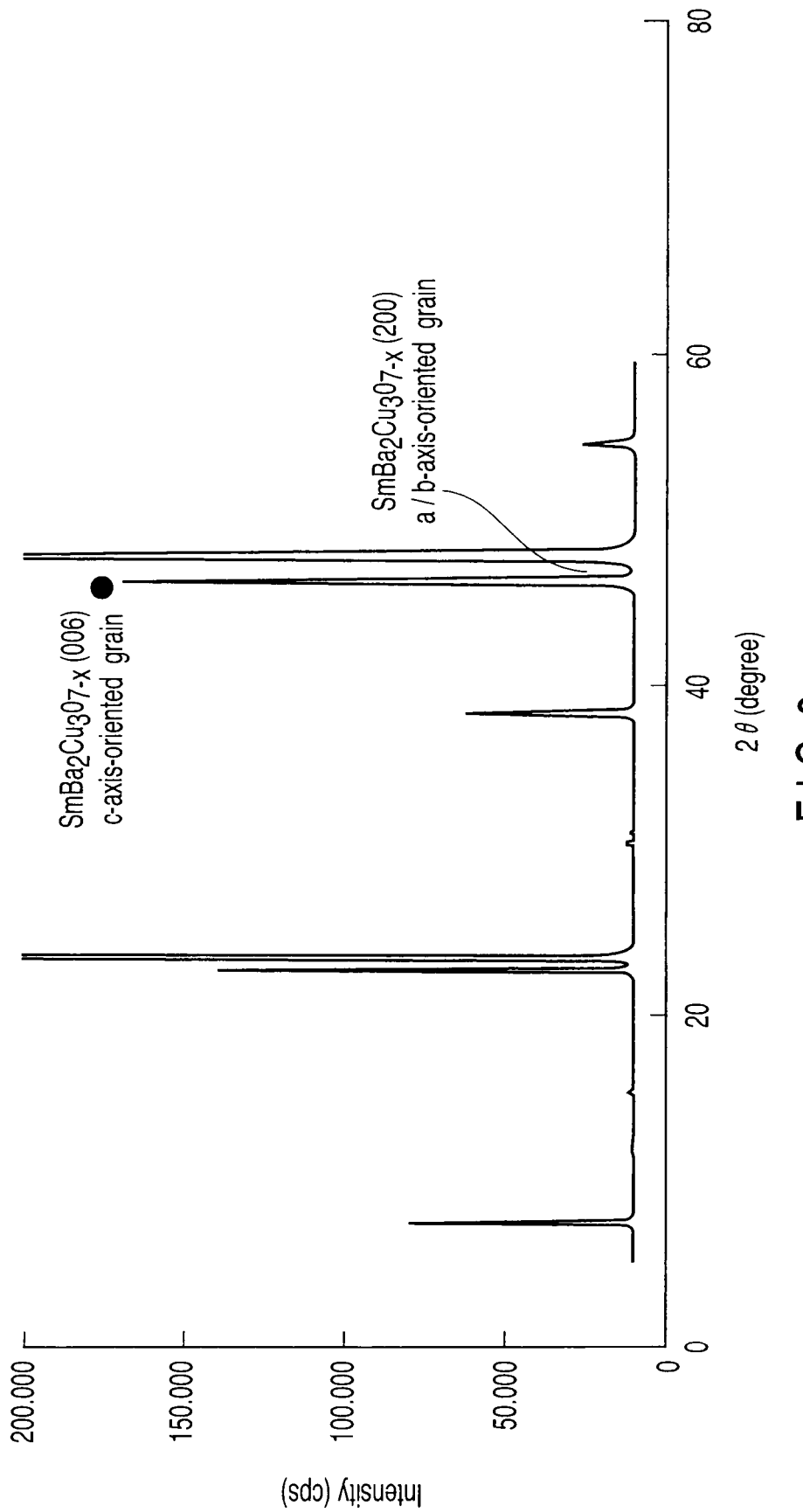
FIG. 9 is an XRD chart for sample Fm1a in Example 1.
Figure 10:
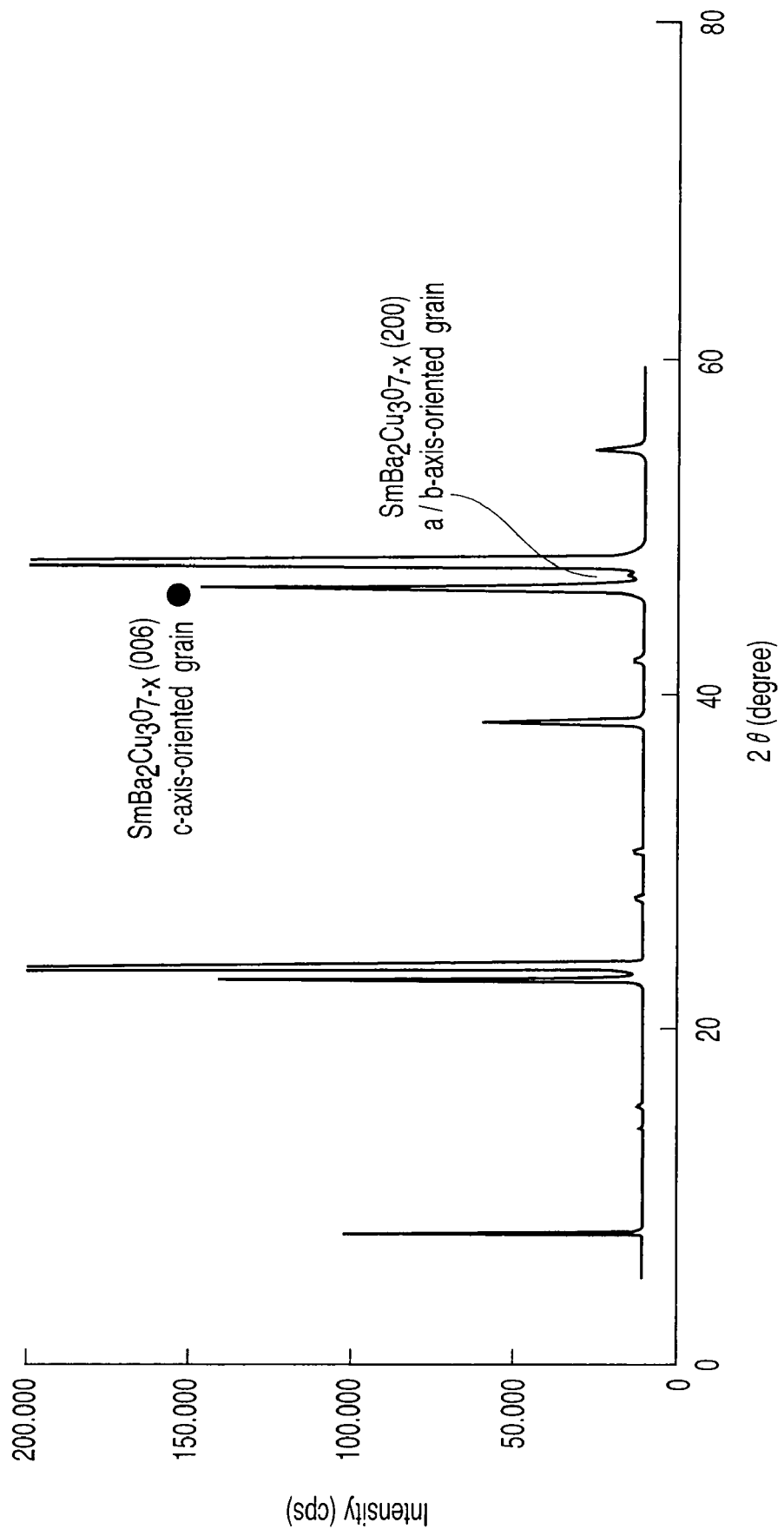
FIG. 10 is an XRD chart for sample Fm1b in Example 1.
Figure 11:
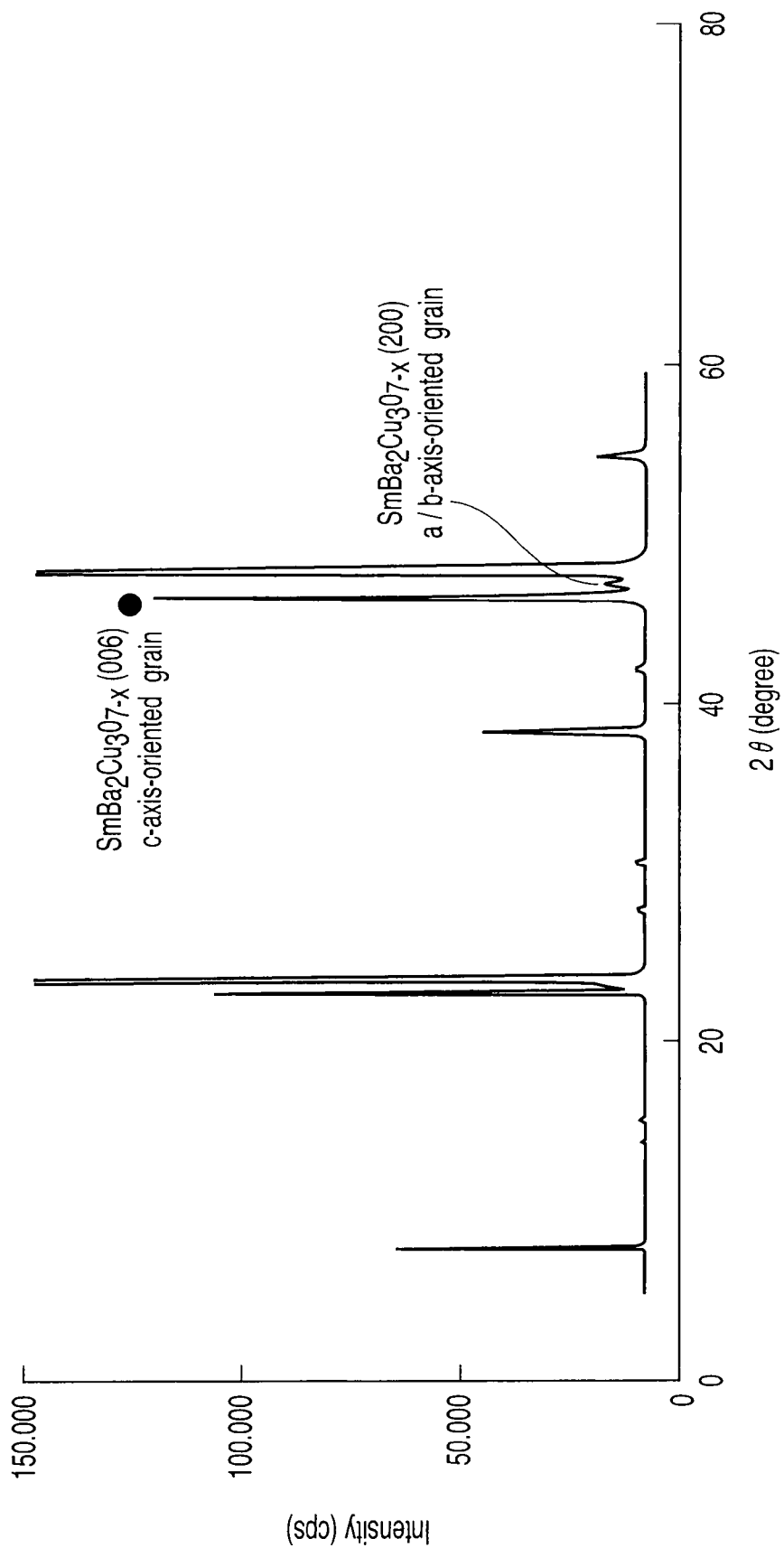
FIG. 11 is an XRD chart for sample Fm1c in Example 1.
Figure 12:
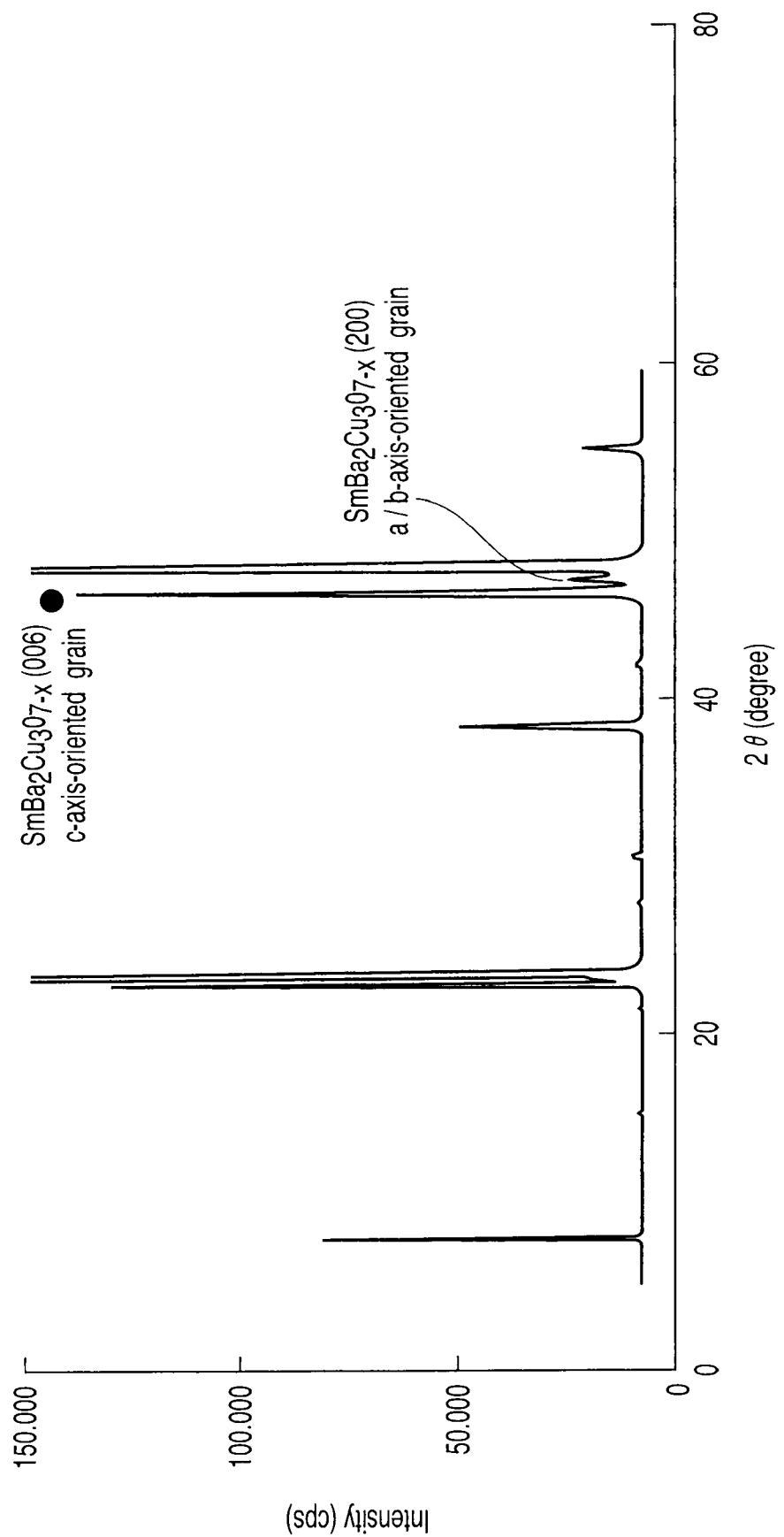
FIG. 12 is an XRD chart for sample Fm1d in Example 1.

Composition analysis was performed on the Sm-based superconducting films Fm1a, Fm1b, Fm1c, and Fm1d from the upper portions of the films by SIMS. FIG. 7 shows the results of Fm1a, and FIG. 8 shows the results of Fm1d. The molar ratio of fluorine to copper was $10^{-2}$ to $10^{-6}$.

Cross-sectional TEM observation was performed on samples Fm1a, Fm1b, Fm1c, and Fm1d. Periodic grain boundaries with an interval of 10 to 20 nm were found in cross-sectional TEM images. The interval of grain boundaries seemed to change in accordance with the annealing conditions.

Figure 13:
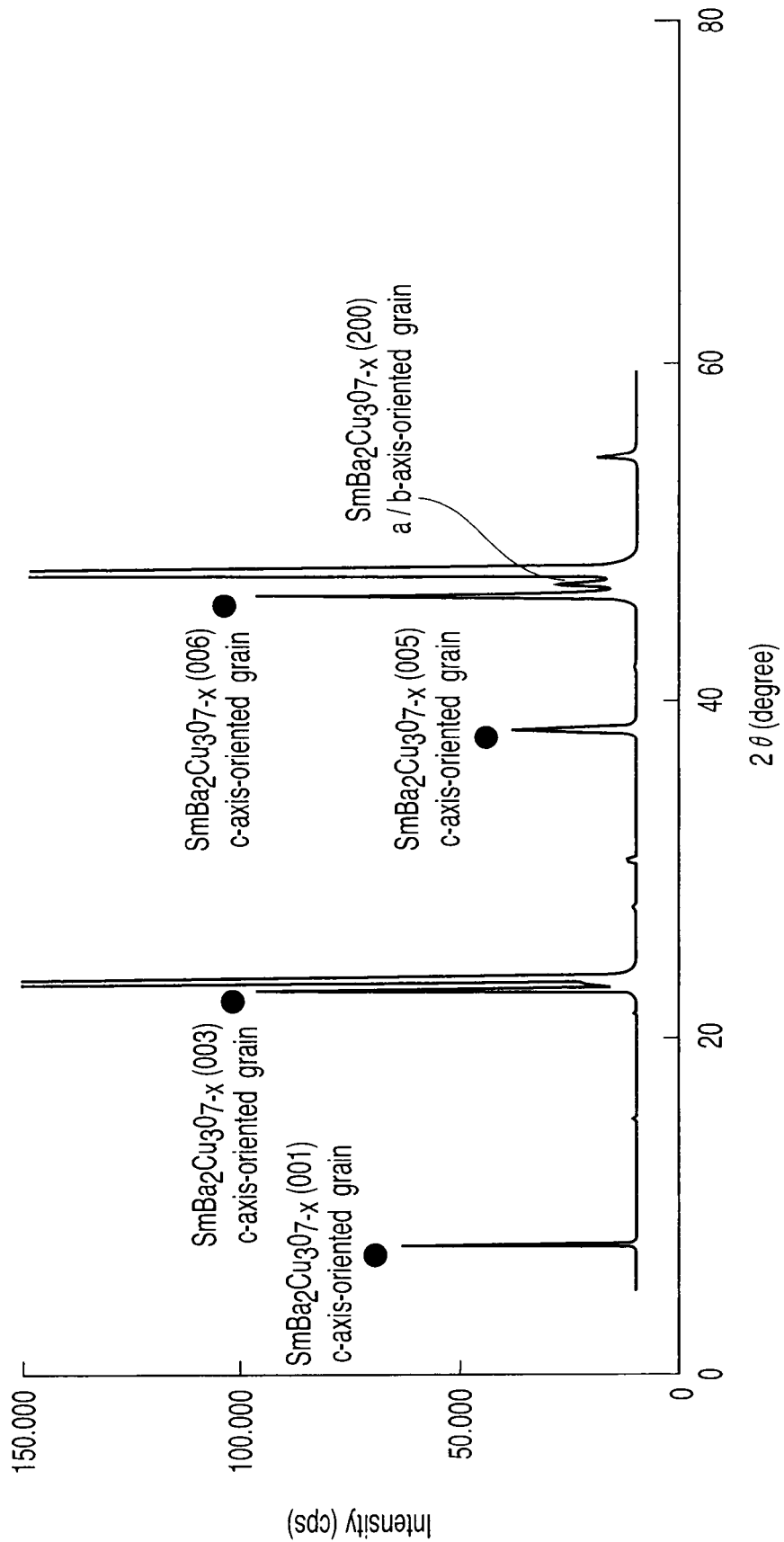
FIG. 13 is an XRD chart for a conventional Sm-based superconducting film.

FIGS. 9, 10, 11, and 12 show the results of X-ray diffraction (Cu-Kα, 40 kV, 50 mA) for samples Fm1a, Fm1b, Fm1c, and Fm1d, respectively. Also, FIG. 13 shows the result of X-ray diffraction for a conventional Sm-based superconducting film that exhibited the best results so far. In FIG. 13, $r_{ab}$ is 17.4%. By contrast, the values of $r_{ab}$ are 2.4%, 3.7%, 7.4%, and 11.3% in FIGS. 9, 10, 11, and 12, respectively, which are favorable values. This comparison indicates that a/b-axis-oriented grains derived from impurities were greatly suppressed in the present Example.

Figure 16:
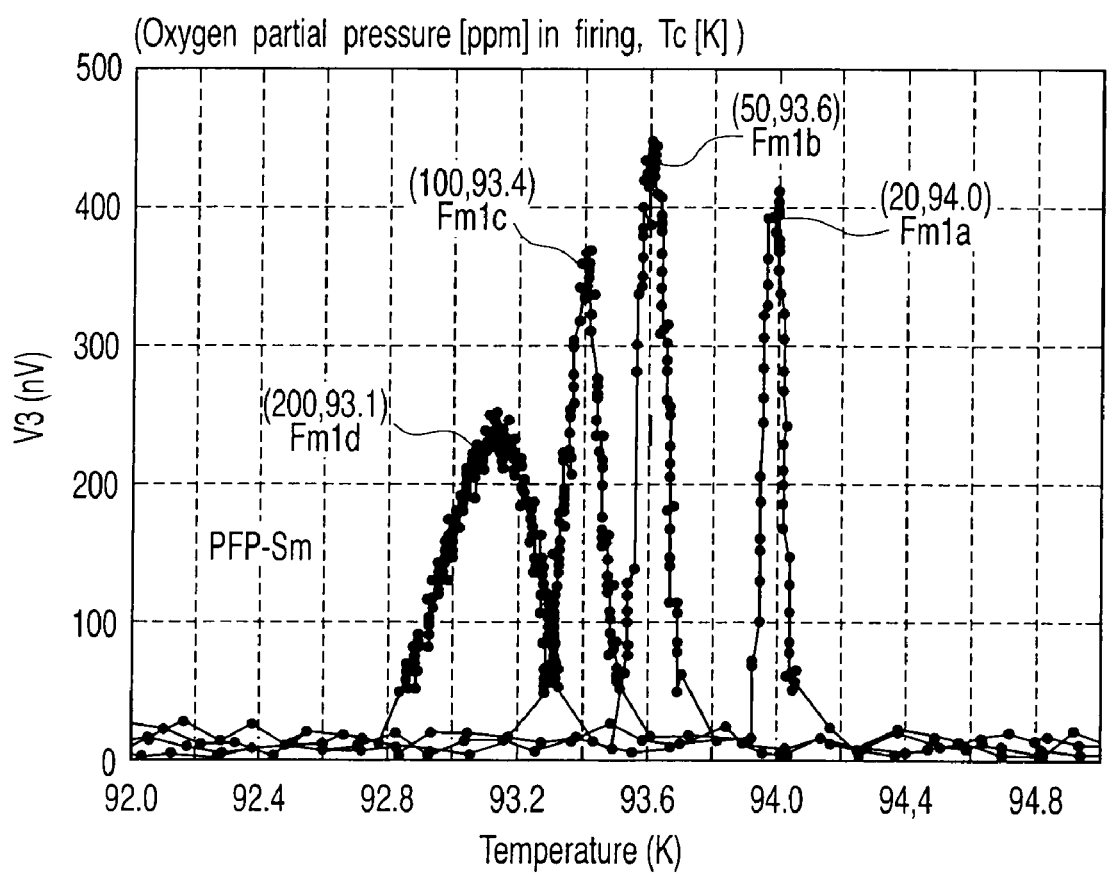
FIG. 16 is a graph showing the dependence of $T_C$ on the annealing conditions of Sm-based superconducting films manufactured in Example 1.

Then, the critical temperature $T_C$ and critical current density $J_C$ of each of samples Fm1a, Fm1b, Fm1c, and Fm1d were measured by the induction method. FIG. 14 shows the $T_C$ measurement data of Fm1a. FIG. 15 shows the $J_C$ measurement data of Fm1a. Although FIG. 15 shows the results of measurements at several points in the central portion of the sample, the maximum one of stably obtained values is used as $J_C$, where the value is assumed to be 5.10 MA/cm$^2$. FIG. 16 shows the dependence of the $T_C$ data on the annealing condition (the oxygen partial pressure during firing) of each of samples Fm1a, Fm1b, Fm1c, and Fm1d. FIG. 16 reveals that $T_C$ is sensitive to the oxygen partial pressure during firing. The highest $T_C$ value was obtained in sample Fm1a for which the oxygen partial pressure during firing was 20 ppm. Also, $T_C$ lowered as the oxygen partial pressure during firing was raised. This is probably because at a high oxygen partial pressure, substitution occurred between Sm and Ba, bringing about deterioration in the superconducting characteristics.

Conventionally, a Sm-based superconducting film manufactured from high-purity solutions prepared by the SIG method by using only trifluoroacetatic acid exhibited $T_C$ of 88.4K and $J_C$ of 0.60 MA/cm$^2$ (77K, 0 T). Accordingly, it is obvious that the Sm-based superconducting films obtained by the method of the present Example have $T_C$ and $J_C$ values much higher than those obtained by the conventional method.

Example 2

Powder of about 3.8 hydrate of (CH$_3$COO)$_3$Sm was dissolved in ion-exchange water. The solution and an equimolar amount of CF$_3$CF$_2$COOH (PFP) were mixed and stirred in an eggplant type flask. The mixture was then reacted and refined under reduced pressure for about 10 hours with a rotary evaporator to prepare semitransparent light-yellow powder SL2app (e in FIG. 1). The powder SL2app was completely dissolved by adding methanol equivalent to a weight about 100 times thereof to prepare a yellow solution. The solution was refined again under reduced pressure for about 12 hours with a rotary evaporator to prepare opaque light-yellow powder SL2ap (i in FIG. 1). The powder SL2ap was dissolved in methanol again and diluted in a measuring flask to prepare a solution SL2a with a concentration of 0.78 mol/L in terms of metal ions (k in FIG. 1).

Powder of anhydrous (CH$_3$COO)$_2$Ba was dissolved in ion-exchange water. The solution and an equimolar amount of CF$_3$COOH (TFA) were mixed and stirred in a beaker to prepare a transparent solution. The solution was placed in an eggplant type flask and reacted and refined under reduced pressure for about 10 hours with a rotary evaporator to prepare semitransparent white powder SL2bpp (e in FIG. 1). The powder SL2 bpp was completely dissolved by adding methanol equivalent to a weight about 100 times thereof to prepare a transparent solution. The solution was refined again under reduced pressure for about 12 hours with a rotary evaporator to prepare semitransparent white powder SL2 bp (i in FIG. 1). The powder SL2 bp was dissolved in methanol again to prepare a transparent solution SL2b (k in FIG. 1).

Powder of about 1.0 hydrate of (CH$_3$COO)$_2$Cu was dissolved in ion-exchange water. The solution and an equimolar amount of fluorocarboxylic acids prepared by mixing CF$_3$COOH (TFA) and CF$_3$CF$_2$COOH (PFP) at ratios of 3:0, 2:1, 1:2, and 0:3 were mixed and stirred to prepare dark-blue solutions, respectively. Each solution was placed in an eggplant type flask and reacted and refined under reduced pressure for about 10 hours with a rotary evaporator to prepare four types of semitransparent blue gels SL2c30 pp, SL2c21 pp, SL2c12 pp, and SL2c03 pp (e in FIG. 1). Each gel was completely dissolved by adding methanol equivalent to a weight about 100 times thereof to prepare a blue solution, respectively. Each solution was refined again under reduced pressure for about 12 hours with a rotary evaporator to prepare four types of blue gels SL2c30p, SL2c21p, SL2c12p, and SL2c03p (i in FIG. 1). Each of blue gels SL2c30p, SL2c21p, SL2c12p, and SL2c03p was dissolved in methanol again and diluted in a measuring flask to prepare four types of solutions SL2c30, SL2c21, SL2c12, and SL2c03 (k in FIG. 1).

The solution SL2a, the solution SL2b, and each of the solutions SL2c30, SL2c21, SL2c12, and SL2c03 were mixed such that the molar ratio of Sm:Ba:Cu was set to 1.00:2.00: 3.00 to prepare four types of coating solutions SL2-30, SL2-21, SL2-12, and SL2-03 (b in FIG. 2). The concentration of each coating solution was about 1.30 mol/L in terms of metal ions.

A (100) $LaAlO_3$ single-crystal substrate was spin-coated with each coating solution under the same conditions as in Example 1 (c in FIG. 2), and calcining and firing (the oxygen partial pressure in a 4.2% humidified oxygen-mixed argon atmosphere during firing at 800° C. was set to 20 ppm) were performed under the conditions described in Example 1 to prepare four types of superconducting films Fm2-30, Fm2-21, Fm2-12, and Fm2-03 (i in FIG. 2).

The thickness of each of samples Fm2-30, Fm2-21, Fm2-12, and Fm2-03 measured by ICP was 200±10 nm. Also, $T_C$ (K) and $J_C$ ($MA/cm^2$, 77K, 0 T) of each of samples Fm2-30, Fm2-21, Fm2-12, and Fm2-03 were measured by the induction method. These results are summarized in Table 1 below.

TABLE 1

Results of Example 2

| Sm solution (Sm molar ratio 1.00) | Ba solution (Ba molar ratio 2.00) | Cu solution (Cu molar ratio 3.00) | Coating solution | Super-conductor | Peak intensity (kcps) | Tc (K) | Jc ($MA/cm^2$, 77K, 0T) |
|---|---|---|---|---|---|---|---|
| SmAc + PFP→ SL2a | BaAc + TFA→ SL2b | CuAc + (3:0)TFA, PFP →SL2c30 | SL2-30 | Fm2-30 | 148 | 94.0 | 5.1 |
| SmAc + PFP→ SL2a | BaAc + TFA→ SL2b | CuAc + (2:1)TFA, PFP →SL2c21 | SL2-21 | Fm2-21 | 142 | 93.9 | 4.8 |
| SmAc + PFP→ SL2a | BaAc + TFA→ SL2b | CuAc + (1:2)TFA, PFP →SL2c12 | SL2-12 | Fm2-12 | 134 | 93.7 | 4.3 |
| SmAc + PFP→ SL2a | BaAc + TFA→ SL2b | CuAc + (0:3)TFA, PFP →SL2c03 | SL2-03 | Fm2-03 | 133 | 93.7 | 4.1 |

SmAc is $(CH_3OCO)_3Sm$, BaAc is $(CH_3OCO)_2Ba$, CuAc is $(CH_3OCO)_2Cu$, TFA is $CF_3COOH$, and PFP is $CF_3CF_2COOH$.

Example 3

Powder of about 3.8 hydrate of $(CH_3COO)_3Sm$ was dissolved in ion-exchange water. The solution and an equimolar amount of $CF_3CF_2COOH$ (PFP) were mixed and stirred in an eggplant type flask. The mixture was then reacted and refined under reduced pressure for about 10 hours with a rotary evaporator to prepare semitransparent light-yellow powder SL3app (e in FIG. 1). The powder SL3app was completely dissolved by adding methanol equivalent to a weight about 100 times thereof to prepare a yellow solution. The solution was refined again under reduced pressure for about 12 hours with a rotary evaporator to prepare opaque light-yellow powder SL3ap (i in FIG. 1). The powder SL3ap was dissolved in methanol again and diluted in a measuring flask to prepare a solution SL3a with a concentration of 0.78 mol/L in terms of metal ions (k in FIG. 1).

Powder of anhydrous $(CH_3COO)_2Ba$ was dissolved in ion-exchange water. The solution and an equimolar amount of $CF_3COOH$ (TFA) were mixed and stirred in a beaker to prepare a transparent solution. The solution was placed in an eggplant type flask and reacted and refined under reduced pressure for about 10 hours with a rotary evaporator to prepare semitransparent white powder SL3 bpp (e in FIG. 1). The powder SL3 bpp was completely dissolved by adding methanol equivalent to a weight about 100 times thereof to prepare a transparent solution. The solution was refined again under reduced pressure for about 12 hours with a rotary evaporator to prepare semitransparent white powder SL3 bp (i in FIG. 1). The powder SL3 bp was dissolved in methanol again to prepare a transparent solution SL3b (k in FIG. 1).

Blue powder of about 1.0 hydrate of $(CH_3COO)_2Cu$ was dissolved in ion-exchange water. The solution and an equimolar amount of $CF_3CF_2COOH$ (PFP), $CF_3CF_2CF_2COOH$ (HFB), or $CF_3CF_2CF_2COOH$ (NFP) were mixed and stirred to prepare three types of dark-blue solutions. Each solution was placed in an eggplant type flask and reacted and refined under reduced pressure for about 10 hours with a rotary evaporator to prepare three types of semitransparent blue gels SL3c1pp, SL3c2 pp, and Sl3c3 pp (e in FIG. 1). Each gel was completely dissolved by adding methanol equivalent to a weight about 100 times thereof to prepare three types of blue solutions, and each solution was refined again under reduced pressure for about 12 hours with a rotary evaporator to prepare three types of blue gels SL3c1p, SL3c2p, and SL3c3p (i in FIG. 1). Each of blue gels SL3c1p, SL3c2p, and SL3c3p was dissolved in methanol again and diluted in a measuring flask to prepare three types of solutions SL3c1, SL3c2, and SL3c3 (k in FIG. 1).

The solution SL3a, the solution SL3b, and each of the solutions SL3c1, SL3c2, and SL3c3 such that the molar ratio of Sm:Ba:Cu was set to 1.00:2.00:3.00 to prepare three types of coating solutions SL3-1, SL3-2, and SL3-3 (b in FIG. 2).

A (100) $LaAlO_3$ single-crystal substrate was spin-coated with each coating solution under the same conditions as in Example 1 (c in FIG. 2), and calcining and firing (the oxygen partial pressure in a 4.2% humidified oxygen-mixed argon atmosphere during firing at 800° C. was set to 20 ppm) were performed under the conditions described in Example 1 to prepare three types of superconducting films Fm3-1, Fm3-2, and Fm3-3 (i in FIG. 2).

$T_C$ (K) and $J_C$ ($MA/cm^2$, 77K, 0 T) of each of samples Fm3-1, Fm3-2, and Fm3-3 were measured by the induction method. These results are summarized in Table 2 below.

The coating solutions SL3-1 and SL3-2 were mixed at mixing ratios 3:1, 2:2, and 1:3, and the coating solutions SL3-1 and SL3-3 were mixed at a mixing ratio of 1:1 to prepare four types of coating solutions SL3x31, SL3x22, SL3x13, and SL3x11.

A (100) $LaAlO_3$ single-crystal substrate was spin-coated with each coating solution under the same conditions as in Example 1 (c in FIG. 2), and calcining and firing (the oxygen partial pressure in a 4.2% humidified oxygen-mixed argon atmosphere during firing at 800° C. was set to 20 ppm) were performed under the conditions described in Example 1 to prepare four types of superconducting films Fmx31, Fmx22, Fmx13, and Fmx11 (i in FIG. 2).

$T_C$ (K) and $J_C$ ($MA/cm^2$, 77K, 0 T) of each of samples Fmx31, Fmx22, Fmx13, and Fmx11 were measured by the induction method. These results are summarized in Table 2 below.

TABLE 2

Results of Example 3

| Sm solution (Sm molar ratio 1.00) | Ba solution (Ba molar ratio 2.00) | Cu solution (Cu molar ratio 3.00) | Coating solution | Super-conductor | Tc (K) | Jc (MA/cm$^2$, 77K, 0T) |
|---|---|---|---|---|---|---|
| SmAc + PFP→ SL3a | BaAc + TFA→ SL3b | CuAc + PFP→ SL3c1 | SL3-1 | Fm3-1 | 93.7 | 4.1 |
| SmAc + PFP→ SL3a | BaAc + TFA→ SL3b | CuAc + HFB→ SL3c2 | SL3-2 | Fm3-2 | 93.4 | 3.4 |
| SmAc + PFP→ SL3a | BaAc + TFA→ SL3b | CuAc + NFP→ SL3c3 | SL3-3 | Fm3-3 | 93.1 | 2.5 |
| — | — | — | 3 × SL3-1 1 × SL3-2 | Fmx31 | 93.6 | 4.0 |
| — | — | — | 2 × SL3-1 2 × SL3-2 | Fmx22 | 93.6 | 4.0 |
| — | — | — | 1 × SL3-1 3 × SL3-2 | Fmx13 | 93.5 | 3.8 |
| — | — | — | 1 × SL3-1 1 × SL3-3 | Fmx11 | 93.2 | 3.5 |

SmAc is $(CH_3OCO)_3Sm$, BaAc is $(CH_3OCO)_2Ba$, CuAc is $(CH_3OCO)_2Cu$, TFA is $CF_3COOH$, PFP is $CF_3CF_2COOH$, HFB is $CF_3CF_2CF_2COOH$, and NFP is $CF_3CF_2CF_2CF_2COOH$.

Example 4

Powder of about 3.8 hydrate of $(CH_3COO)_3Sm$ was dissolved in ion-exchange water. The solution and an equimolar amount of $CF_3CF_2COOH$ (PFP) were mixed and stirred in an eggplant type flask. The mixture was then reacted and refined under reduced pressure for about 10 hours with a rotary evaporator to prepare semitransparent light-yellow powder SL4app (e in FIG. 1). The powder SL4app was completely dissolved by adding methanol equivalent to a weight about 100 times thereof to prepare a yellow solution. The solution was refined again under reduced pressure for about 12 hours with a rotary evaporator to prepare opaque light-yellow powder SL4ap (i in FIG. 1). The powder SL4ap was dissolved in methanol again and diluted in a measuring flask to prepare a solution SL4a with a concentration of 0.78 mol/L in terms of metal ions (k in FIG. 1).

Powder of anhydrous $(CH_3COO)_2Ba$ was dissolved in ion-exchange water. The solution and an equimolar amount of $CH_2FCOOH$ (MFA), $CHF_2COOH$ (DFA), or $CF_3COOH$ (TFA) were mixed and stirred in a beaker to prepare three types of transparent solutions. Each solution was placed in an eggplant type flask and reacted and refined under reduced pressure for about 10 hours with a rotary evaporator to prepare three types of semitransparent white powders SL4b1pp, SL4b2 pp, and SL4b3 pp (e in FIG. 1). Each powder of SL4b1pp, SL4b2 pp, and SL4b3 pp was completely dissolved by adding methanol equivalent to a weight about 100 times thereof to prepare three types of transparent solutions. Each solution was refined again under reduced pressure for about 12 hours with a rotary evaporator to prepare three types of semitransparent white powders SL4b1p, SL4b2p, and SL4b3p (i in FIG. 1). Each powder was dissolved in methanol again and diluted in a measuring flask to prepare three types of solutions SL4b1, SL4b2, and SL4b3 (k in FIG. 1).

Powder of about 1.0 hydrate of $(CH_3COO)_2Cu$ was dissolved in ion-exchange water. The solution and an equimolar amount of $CHF_2COOH$ (DFA) or $CF_3COOH$ (TFA) were mixed and stirred to prepare two types of dark-blue solutions. Each solution was placed in an eggplant type flask and reacted and refined under reduced pressure for about 10 hours with a rotary evaporator to prepare two types of semitransparent blue gels SL4c1pp and SL4c2 pp (e in FIG. 1). Each gel was completely dissolved by adding methanol equivalent to a weight about 100 times thereof to prepare two types of blue solutions. Each solution was refined again under reduced pressure for about 12 hours with a rotary evaporator to prepare two types of blue gels SL4c1p and SL4c2p (i in FIG. 1). Each gel was dissolved in methanol again and diluted in a measuring flask to prepare two types of solutions SL4c1 and SL4c2 (k in FIG. 1).

The solution SL4a, each of the solutions SL4b1, SL4b2 and SL4b3, and the solution SL4c2 were mixed such that the molar ratio of Sm:Ba:Cu was set to 1.00:2.00:3.00 to prepare three types of coating solutions SL4-11, SL4-12, and SL4-13.

Also, the solution SL4a, the solution SL4b3, and each of the solutions SL4c1 and SL4c2 were mixed such that the molar ratio of Sm:Ba:Cu was set to 1.00:2.00:3.00 to prepare two types of coating solutions SL4-21 and SL4-22.

A (100) $LaAlO_3$ single-crystal substrate was spin-coated with each coating solution under the same conditions as in Example 1 (c in FIG. 2), and calcining and firing (the oxygen partial pressure in a 4.2% humidified oxygen-mixed argon atmosphere during firing at 800° C. was set to 20 ppm) were performed under the conditions described in Example 1 to prepare five types of superconducting films Fm4-11, Fm4-12, Fm4-13, Fm4-21, and Fm4-22 (i in FIG. 2).

$T_C$ (K) and $J_C$ (MA/cm$^2$, 77K, 0 T) of each of samples Fm4-11, Fm4-12, Fm4-13, Fm4-21, and Fm4-22 were measured by the induction method. These results are summarized in Table 3 below.

TABLE 3

Results of Example 4

| Sm solution (Sm molar ratio 1.00) | Ba solution (Ba molar ratio 2.00) | Cu solution (Cu molar ratio 3.00) | Coating solution | Super-conductor | Peak intensity (kcps) | Tc (K) | Jc (MA/cm$^2$, 77K, 0T) |
|---|---|---|---|---|---|---|---|
| SmAc + PFP→ SL4a | BaAc + MFA→ SL4b1 | CuAc + TFA→ SL4c2 | SL4-11 | Fm4-11 | 142 | 93.8 | 4.3 |

TABLE 3-continued

Results of Example 4

| Sm solution (Sm molar ratio 1.00) | Ba solution (Ba molar ratio 2.00) | Cu solution (Cu molar ratio 3.00) | Coating solution | Super- conductor | Peak intensity (kcps) | Tc (K) | Jc (MA/cm$^2$, 77K, 0T) |
|---|---|---|---|---|---|---|---|
| SmAc + PFP→ SL4a | BaAc + DFA→ SL4b2 | CuAc + TFA→ SL4c2 | SL4-12 | Fm4-12 | 148 | 93.9 | 4.8 |
| SmAc + PFP→ SL4a | BaAc + TFA→ SL4b3 | CuAc + TFA→ SL4c2 | SL4-13 | Fm4-13 | 150 | 94.0 | 5.1 |
| SmAc + PFP→ SL4a | BaAc + TFA→ SL4b3 | CuAc + DFA→ SL4c1 | SL4-21 | Fm4-21 | 145 | 93.9 | 4.7 |
| SmAc + PFP→ SL4a | BaAc + TFA→ SL4b3 | CuAc + TFA→ SL4c2 | SL4-22 | Fm4-22 | 150 | 94.0 | 5.1 |

SmAc is $(CH_3OCO)_3Sm$, BaAc is $(CH_3OCO)_2Ba$, CuAc is $(CH_3OCO)_2Cu$, MFA is $CH_2FCOOH$, DFA is $CHF_2COOH$, TFA is $CF_3COOH$, PFP is $CF_3CF_2COOH$.

Example 5

Powder of about 1.5 hydrate of $(CH_3COO)_3La$ and powder of about 1.0 hydrate of $(CH_3COO)_3Nd$ were dissolved in ion-exchange water, respectively. Each solution and an equimolar amount of $CF_3CF_2COOH$ (PFP) were mixed and stirred in an eggplant type flask. Each mixture was then reacted and refined under reduced pressure for about 10 hours with a rotary evaporator to prepare semitransparent white powder SL5a1pp and semitransparent purple powder SL5a2 pp (e in FIG. 1). Each powder was completely dissolved by adding methanol equivalent to a weight about 100 times thereof to prepare a transparent solution and a light-purple solution. Each solution was refined again under reduced pressure for about 12 hours with a rotary evaporator to prepare semitransparent white powder SL5a1pp and semitransparent purple powder SL5a2 pp (I in FIG. 1). Each powder was dissolved in methanol again and diluted in a measuring flask to prepare a solution SL5a1 with a concentration of about 0.90 mol/L in terms of metal ions, and a solution SL5a2 with a concentration of about 0.32 mol/L in terms of metal ions (k in FIG. 1).

Powder of anhydrous $(CH_3COO)_2Ba$ and powder of about 1.0 hydrate of $(CH_3COO)_2Cu$ were dissolved in ion-exchange water, respectively. Each solution and an equimolar amount of $CF_3COOH$ (TFA) were mixed and stirred in a beaker. The two solutions were mixed in an eggplant type flask such that the molar ratio of metal ion was set to 2.00:3.00 to prepare a dark-blue solution. The solution was reacted and refined under reduced pressure for about 10 hours with a rotary evaporator to prepare a semitransparent blue gel SL5bcpp (e in FIG. 1). The gel SL5bcpp was completely dissolved by adding methanol equivalent to a weight about 100 times thereof to prepare a blue solution. The solution was refined again under reduced pressure for about 12 hours with a rotary evaporator to prepare a blue gel SL5bcp (i in FIG. 1). The blue gel SL5bcp was dissolved in methanol again and diluted in a measuring flask to prepare a solution SL5bc with a concentration of 1.50 mol/L in terms of metal ions (k in FIG. 1).

Each of the solutions SL5a1 and SL5a2, and the solution SL5bc were mixed such that the molar ratio of La:Ba:Cu or Nd:Ba:Cu was set to 1.00:2.00:3.00 to prepare two types of coating solutions SL5-1 and SL5-2 (b in FIG. 2).

A (100) $LaAlO_3$ single-crystal substrate was spin-coated with each coating solution under the same conditions as in Example 1 (c in FIG. 2), and calcining and firing (the oxygen partial pressure in a 4.2% humidified oxygen-mixed argon atmosphere during firing at 800° C. was set to 9 ppm) were performed under the conditions described in Example 1 to prepare two types of superconducting films Fm5-1 and Fm5-2 (i in FIG. 2).

Figure 17:
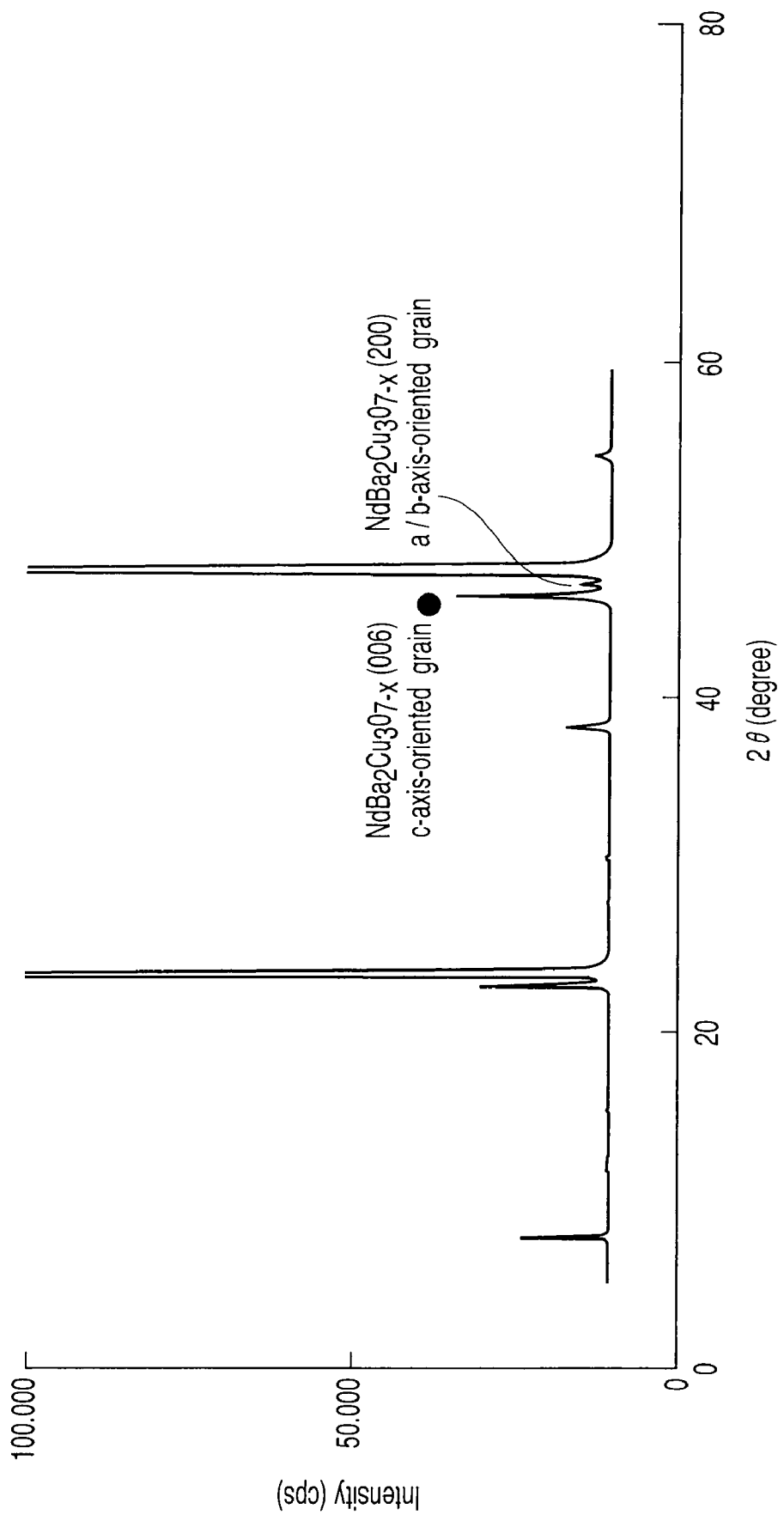
FIG. 17 is an XRD chart for sample Fm5-1 in example 5.
Figure 18:
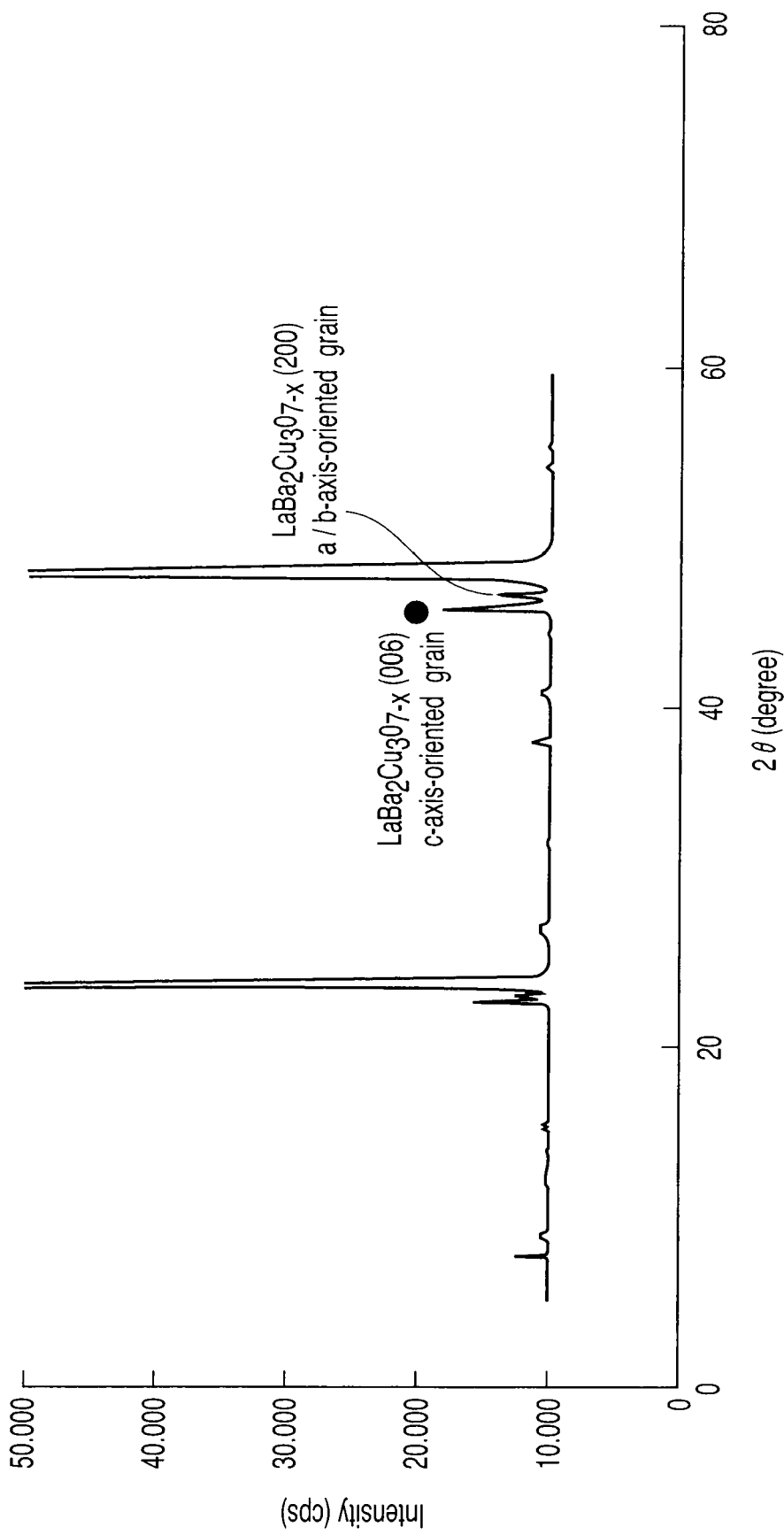
FIG. 18 is an XRD chart for sample Fm5-2 in example 5.

FIGS. 17 and 18 show the results of X-ray diffraction for Fm5-1 and Fm5-2, respectively. As shown in FIGS. 17 and 18, typical patterns were obtained in which, compared to the Sm-based superconductors, the c-axis peaks of the Nd-based superconductor were observed at lower angles, and the c-axis peaks of the La-based superconductor were observed at angles lower than those of the Nd-based superconductor. The $r_{ab}$ value of the Nd-based superconductor was 5.0%, and the $r_{ab}$ value of the La-based superconductor was 32.1%.

Figure 19:
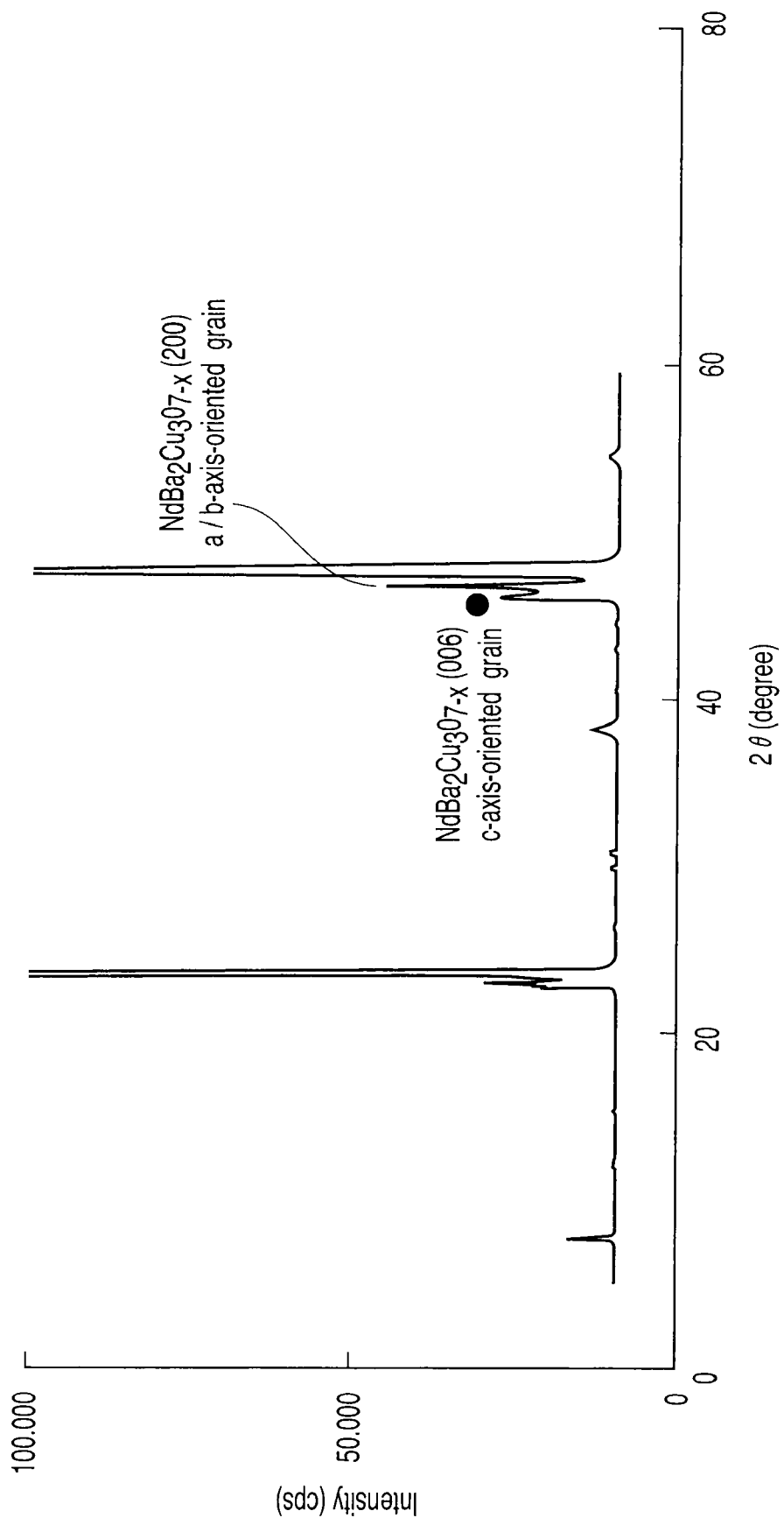
FIG. 19 is an XRD chart for a conventional Nd-based superconducting film.

For comparison, FIG. 19 shows the result of X-ray diffraction for a Nd-based superconducting film manufactured by conventional TFA-MOD using solutions synthesized by the SIG method. Referring to FIG. 19, the $r_{ab}$ value reaches 66.7%. In the Nd-based superconducting film, no superconducting characteristics were obtained at 77K. Although not shown, an Sm-based superconducting film exhibited the $r_{ab}$ value of 23.4%, $T_C$ of 84.0K, and $J_C$ of 0.22 MA/cm$^2$ (77K, 0 T).

As can be seen from the comparison of FIGS. 17 and 19, the Nd-based superconducting film greatly improved in characteristics, so good practical-level characteristics were obtained at 77K. Although the $T_C$ value was low, the value would be likely to be improved in the future.

Also, in an La-based superconducting film obtained by the conventional method, even a c-axis-oriented peak was not observed by XRD. By contrast, as shown in FIG. 18, the La-based superconducting film according to the present Example exhibited an oriented structure.

$T_C$ (K) and $J_C$ (MA/cm$^2$, 77K, 0 T) of each of samples Fm5-1 and Fm5-2 were measured by the induction method. These results are summarized in Table 4 below.

TABLE 4

Results of Example 5

| La solution or Nd solution (La or Nd molar ratio 1.00) | (Ba + Cu) solution (Ba molar ratio 2.00, Cu molar ratio 3.00) | Coating solution | Super-conductor | Peak intensity (cps) | Tc (K) | Jc (MA/cm$^2$, 77K, 0T) |
|---|---|---|---|---|---|---|
| LaAc + PFP→ SL5a1 | (BaAc, CuAc) + TFA→SL5bc | SL5-1 | Fm5-1 | 8,600 | 90.9 | 0.20 |
| NdAc + PFP→ SL5a2 | (BaAc, CuAc) + TFA→ SL5bc | SL5-2 | Fm5-2 | 89,000 | 93.6 | 4.4 |

LaAc is $(CH_3OCO)_3La$, NdAc is $(CH_3OCO)_3Nd$, BaAc is $(CH_3OCO)_2Ba$, CuAc is $(CH_3OCO)_2Cu$, PFP is $CF_3CF_2COOH$, and TFA is $CF_3COOH$.

Conventionally, the La- and Nd-based superconducting films obtained from high-purity solutions prepared by the SIG method using only trifluoroacetates (TFA) did not exhibit good characteristics. In contrast, when the method of the present Example was used, the Nd-based superconducting film exhibited especially good characteristics. This is because an esterification reaction could be suppressed by the use of pentafluoropropionic acid (PFP). However, the La-based superconducting film obtained by the present Example exhibited characteristics of much inferior to those reported.

Figure 20:
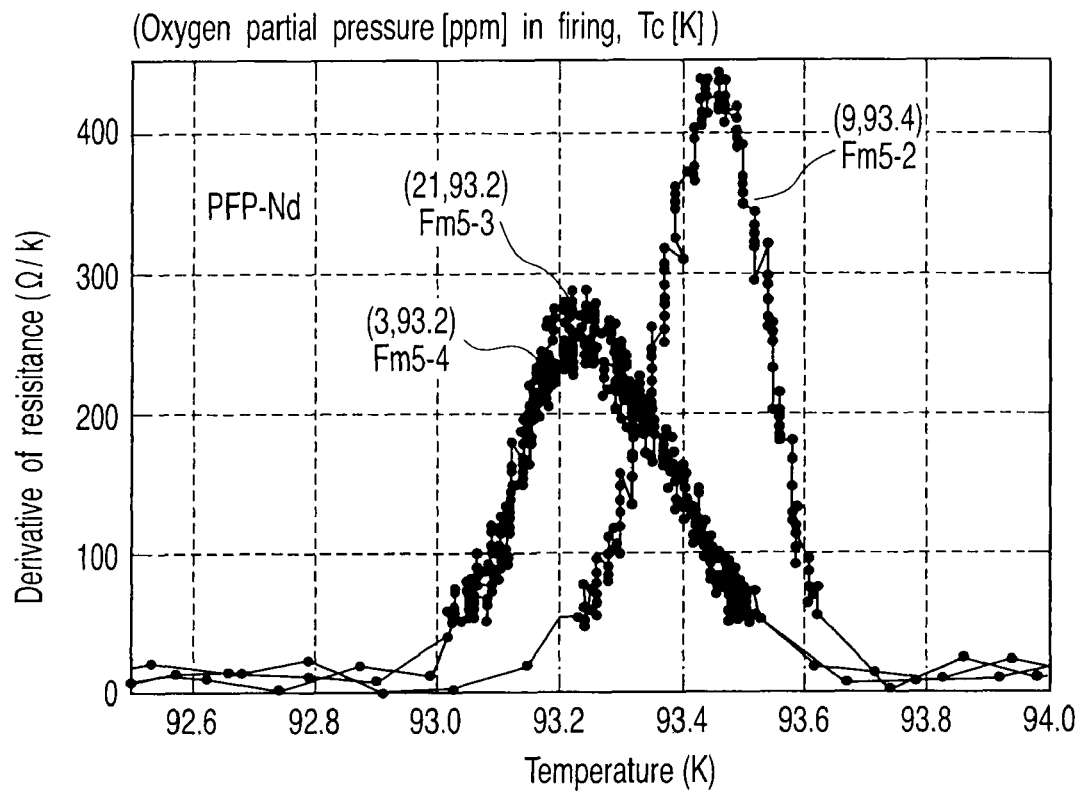
FIG. 20 is a graph showing the dependence of $T_C$ on the annealing conditions of Nd-based superconducting films manufactured in Example 5.

Furthermore, two more types of superconducting films Fm5-3 and Fm5-4 were prepared by setting the oxygen partial pressure during firing to 21 and 3 ppm, respectively, as compared with Fm5-2 for which the oxygen partial pressure during firing was 9 ppm. FIG. 20 shows the results of $T_C$ measurements for samples Fm5-2, Fm5-3, and Fm5-4. As shown in FIG. 20, the measurement results demonstrate that the derivative of resistance spread over a wide temperature range. This is presumably because low-concentration oxygen gas of about 10 ppm cannot be stably supplied at present. However, it is expected that the characteristics could be improved by optimizing the annealing conditions and the like.

Example 6

Powder of about 3.6 hydrate of $(CH_3COO)_3Y$, powder of about 3.8 hydrate of $(CH_3COO)_3Sm$, and powder of about 1.0 hydrate of $(CH_3COO)_3Nd$ were dissolved in ion-exchange water, respectively. Each solution and an equimolar amount of $CF_3CF_2COOH$ (PFP) were mixed and stirred in an eggplant type flask. Each mixtures was then reacted and refined under reduced pressure for about 10 hours with a rotary evaporator to prepare semitransparent white powder SL6a1pp, semitransparent yellow powder SL6a2 pp, and semitransparent purple powder SL6a3 pp (e in FIG. 1).

Powder of about 3.6 hydrate of $(CH_3COO)_3Y$ was dissolved in ion-exchange water. The solution and an equimolar amount of $CF_3COOH$ (TFA) were mixed and stirred in an eggplant type flask. The mixture was then reacted and refined under reduced pressure for about 10 hours with a rotary evaporator to prepare semitransparent white powder SL6a4 pp (e in FIG. 1).

Each of the powders SL6a1pp, SL6a2 pp, SL6a3 pp, and SL6a4 pp was completely dissolved by adding methanol equivalent to a weight about 100 times thereof to prepare a transparent solution, a yellow solution, a light-purple solution, and a transparent solution, respectively. Each solution was refined again under reduced pressure for about 12 hours with a rotary evaporator to prepare semitransparent white powder SL6a1p, semitransparent yellow powder SL6a2p, semitransparent purple powder SL6a3p, and semitransparent white powder SL6a4p (i in FIG. 1). Each powder was dissolved in methanol again and diluted in a measuring flask to prepare four types of solutions SL6a1, SL6a2, SL6a3, and SL6a4 (k in FIG. 1).

Powder of anhydrous $(CH_3COO)_2Ba$ and powder of about 1.0 hydrate of $(CH_3COO)_2Cu$ were dissolved in ion-exchange water, respectively. Each solution and an equimolar amount of $CF_3COOH$ (TFA) were mixed and stirred in a beaker. The two solutions were mixed in an eggplant type flask such that the molar ratio of metal ion was set to 2.00:3.00 to prepare a dark-blue solution. The solution was reacted and refined under reduced pressure for about 10 hours with a rotary evaporator to prepare a semitransparent blue gel SL6bcpp (e in FIG. 1). The gel SL6bcpp was completely dissolved by adding methanol equivalent to a weight about 100 times thereof to prepare a blue solution. The solution was refined again under reduced pressure for about 12 hours with a rotary evaporator to prepare a blue gel SL6bcp (i in FIG. 1). The blue gel SL6bcp was dissolved in methanol again and diluted in a measuring flask to prepare a solution SL6bc with a concentration of 1.50 mol/L in terms of metal ions (k in FIG. 1).

Each of solutions SL6a1, SL6a2, SL6a3, and SL6a4 and the solution SL6bc were mixed such that the molar ratio of M:Ba:Cu (M=Y, Nd, and Sm) was set to 1.00:2.00:3.00 to prepare four types of coating solutions SL6-1, SL6-2, SL6-3, and SL6-4 (b in FIG. 2).

The coating solutions SL6-1 and SL6-2 were mixed at ratios of 5:0, 4:1, 3:2, 2:3, 1:4, and 0:5, respectively, to prepare six types of coating solutions SL6x1250, SL6x1241, SL6x1232, SL6x1223, SL6x1214, and SL6x1205 [Y(PFP)—Sm-based coating solutions].

Similarly, the coating solutions SL6-1 and SL6-3 were mixed at ratios of 5:0, 4:1, 3:2, 2:3, 1:4, and 0:5, respectively, to prepare six types of coating solutions SL6x1350, SL6x1341, SL6x1332, SL6x1323, SL6x1314, and SL6x1305 [Y(PFP)—Nd-based coating solutions].

Likewise, the coating solutions SL6-2 and SL6-4 were mixed at ratios of 5:0, 4:1, 3:2, 2:3, 1:4, and 0:5, respectively, to prepare six types of coating solutions SL6x2450, SL6x2441, SL6x2432, SL6x2423, SL6x2414, and SL6x2405 [Sm—Y(TFA)-based coating solutions].

A (100) $LaAlO_3$ single-crystal substrates was spin-coated with each of the 18 types of coating solutions described above under the same conditions as in Example 1 (c in FIG. 2). As shown in FIG. 4, calcining was performed in a 4.2% humidified oxygen atmosphere by setting the time under 200° C. to 250° C. to 11 hours and 43 minutes (703 minutes). Then, as shown in FIG. 5, firing was performed in a 4.2% humidified oxygen-mixed argon atmosphere at 800° C. (the oxygen partial pressure was set to within a range of 9 to 1,000 ppm). After that, annealing was performed by lowering the temperature in a dry oxygen-mixed argon atmosphere and then in a dry oxygen atmosphere from a predetermined starting temperature of 525° C. or less, thereby preparing 18 types of superconducting films Fm6-1250, Fm6-1241, Fm6-1232, Fm6-1223, Fm6-1214, Fm6-1205, Fm6-1350, Fm6-1341, Fm6-1332, Fm6-1323, Fm6-1314, Fm6-1305, Fm6-2450, Fm6-2441, Fm6-2432, Fm6-2423, Fm6-2414, and Fm6-2405 (i in FIG. 2). Note that the oxygen partial pressure during firing and the oxygen annealing starting temperature for each film were set by distributing, in accordance with the mixing ratio, the optimum annealing conditions for solutions before mixing based on simple proportional distribution.

Figure 21:
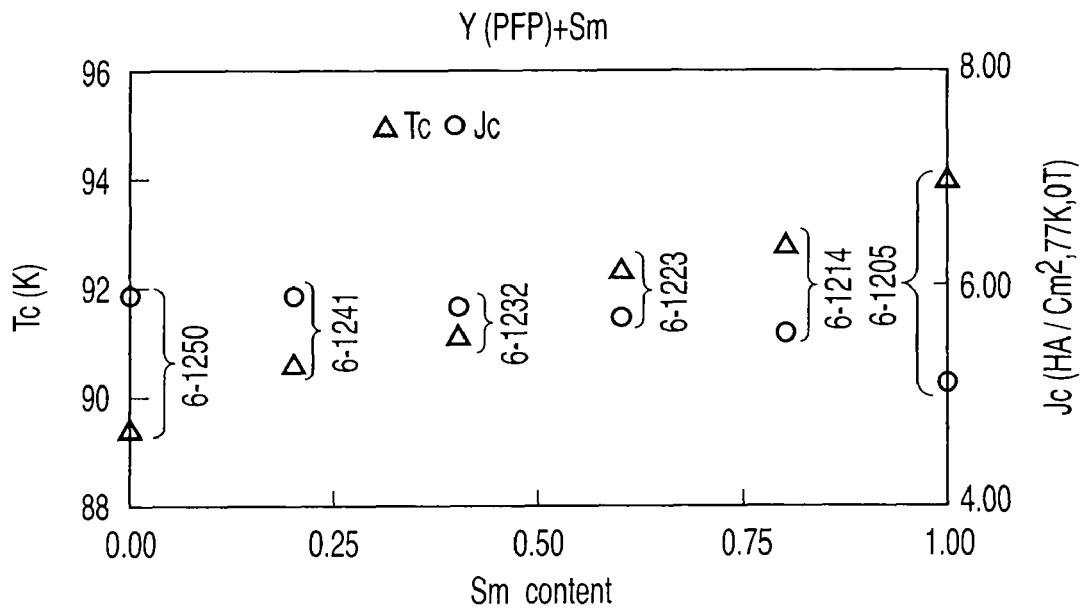
FIG. 21 is a graph showing $T_C$ and $J_C$ of mixed superconducting films of a Y-based superconductor obtained by using PFP and a Sm-based superconductor in Example 6.
Figure 22:
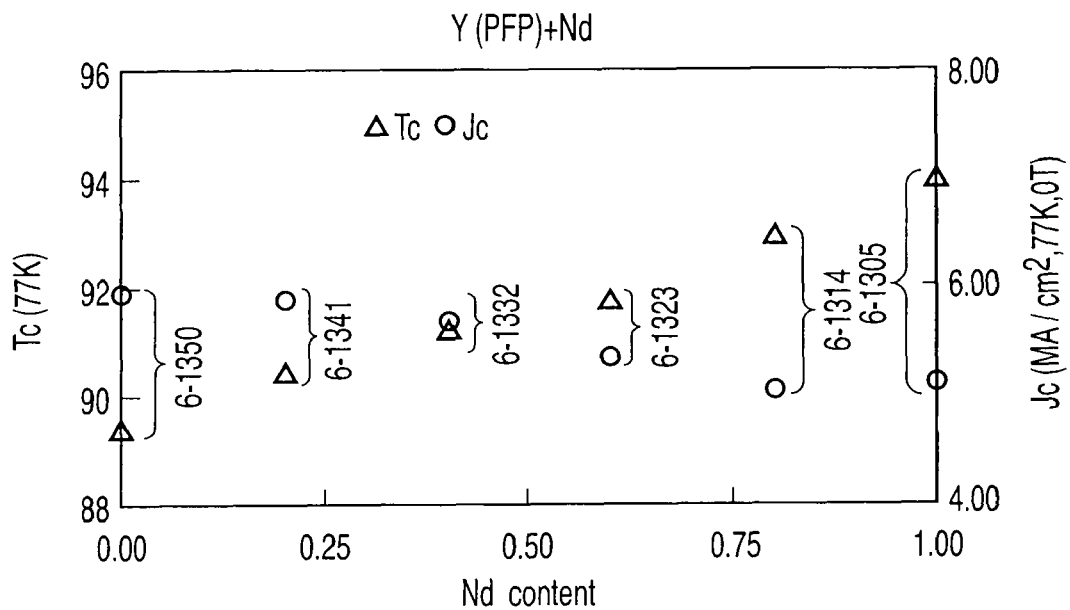
FIG. 22 is a graph showing $T_C$ and $J_C$ of mixed superconducting films of a Y-based superconductor obtained by using PFP and a Nd-based superconductor in Example 6.
Figure 23:
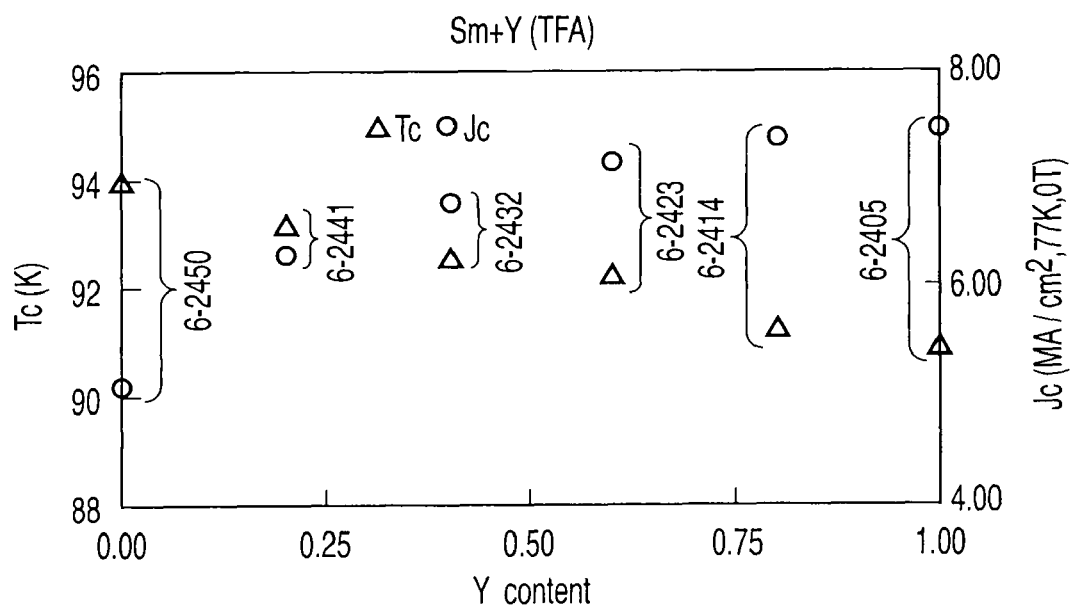
FIG. 23 is a graph showing $T_C$ and $J_C$ of mixed superconducting films of a Y-based superconductor obtained by using TFA and a Sm-based superconductor in Example 6.

The superconducting characteristics of the above 18 types of superconducting films were measured. FIG. 21 shows $T_C$ and $J_C$ of samples Fm6-1250, Fm6-1241, Fm6-1232, Fm6-1223, Fm6-1214, and Fm6-1205. FIG. 22 shows $T_C$ and $J_C$ of samples Fm6-1350, Fm6-1341, Fm6-1332, Fm6-1323, Fm6-1314, and Fm6-1305. FIG. 23 shows $T_C$ and $J_C$ of samples Fm6-2450, Fm6-2441, Fm6-2432, Fm6-2423, Fm6-2414, and Fm6-2405.

From these results, it is found that a sample prepared by mixing solutions has characteristics intermediate between those of samples each prepared by using a single solution. It is also found that a film prepared by mixing an Nd- or Sm-based solution with a Y-based solution exhibited a high $T_C$ value that could not be provided by any conventional film.

Example 7

Powder of about 3.8 hydrate of $(CH_3COO)_3Sm$ was dissolved in ion-exchange water. The solution and an equimolar amount of $CF_3CF_2COOH$ (PFP) were mixed and stirred in an eggplant type flask. The mixture was then reacted and refined under reduced pressure for about 10 hours with a rotary evaporator to prepare semitransparent light-yellow powder SL7app (e in FIG. 1). The powder SL7app was completely dissolved by adding methanol equivalent to a weight about 100 times thereof to prepare a yellow solution. The solution was refined again under reduced pressure for about 12 hours with a rotary evaporator to prepare opaque light-yellow powder SL7ap (i in FIG. 1). The powder SL7ap was dissolved in methanol again and diluted in a measuring flask to prepare a solution SL7a with a concentration of 0.78 mol/L in terms of metal ions (k in FIG. 1).

The volume of solution SL7a was reduced to about ⅕ with a rotary evaporator, thereby producing a yellow precipitate of $(CF_3CF_2COO)_3Sm$. $CF_3COOH$ (TFA) was added to the solution to substitute PFP with TFA and completely dissolve the precipitate to prepare a $(CF_3COO)_3Sm$ solution. The solution was concentrated with a rotary evaporator to remove PFP mainly, and then the concentrated solution was dissolved in methanol to prepare a solution SL7t.

Powder of anhydrous $(CH_3COO)_2Ba$ and powder of about 1.0 hydrate of $(CH_3COO)_2Cu$ were dissolved in ion-exchange water, respectively. Each solution and an equimolar amount of $CF_3COOH$ (TFA) were mixed and stirred in a beaker. The two solutions were mixed in an eggplant type flask such that the molar ratio of metal ion was set to 2.00:3.00 to prepare a dark-blue solution. The solution was reacted and refined under reduced pressure for about 10 hours with a rotary evaporator to prepare a semitransparent blue gel SL7bcpp (e in FIG. 1). The gel SL7bcpp was completely dissolved by adding methanol equivalent to a weight about 100 times thereof to prepare a blue solution. The solution was refined again under reduced pressure for about 12 hours with a rotary evaporator to prepare a blue gel SL7bcp (i in FIG. 1). The blue gel SL7bcp was dissolved in methanol again and diluted in a measuring flask to prepare a solution SL7bc with a concentration of 1.50 mol/L in terms of metal ions (k in FIG. 1).

The solutions SL7at and SL7bc were mixed such that the molar ratio of Sm:Ba:Cu was set to 1.00:2.00:3.00 to prepare a coating solution SL7 (b in FIG. 2).

A (100) $LaAlO_3$ single-crystal substrate was spin-coated with the coating solution SL7 under the same conditions as in Example 1 (c in FIG. 2), and calcining and firing (the oxygen partial pressure in a 4.2% humidified oxygen-mixed argon atmosphere during firing at 800° C. was set to 20 ppm) were performed under the conditions described in Example 1 to prepare a Sm-based superconducting film Fm7 (i in FIG. 2).

Composition analysis by SIMS performed from the upper portion of the film of sample Fm7 revealed that the residual fluorine ion in the film was $10^{-2}$ to $10^{-6}$ with respect to the copper ion.

Also, according to cross-sectional TEM observation, it was found that sample Fm7 had a structure substantially equal to that of a Y-based superconductor. More specifically, periodic grain boundaries appeared at an interval of 5 to 50 nm in cross-sectional TEM images. The interval of the grain boundaries seemed to vary in accordance with the annealing conditions.

$T_C$ (K) and $J_C$ (MA/cm$^2$, 77K, 0 T) of sample Fm7 were measured by the induction method, resulting in $T_C$ of 94.2K and $J_C$ of 5.6 MA/cm$^2$.

In the present Example, superconducting characteristics superior to those of Example 1 were obtained because pentafluoroacetic acid groups of $(CF_3CF_2COO)_3Sm$ were substituted by trifluoroacetatic acid groups. That is, a superconducting film with satisfactory characteristics can also be obtained in the case of using such a method that PFP is used to suppress an esterification reaction and the PFP is substituted by TFA. However, whether the difference is significant is not clear at this stage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oxide superconductor formed as a film on a substrate, comprising a main component represented by $LaBa_2Cu_3O_{7-x}$, and fluorine at a molar ratio of $10^{-2}$ to $10^{-6}$ with respect to copper, wherein a ratio of a biaxially oriented layer at an interface between the substrate and the $LaBa_2Cu_3O_{7-x}$ film is not less than 95%, and a ratio of a biaxially oriented layer in a surface portion of the film is not more than 80% based on transmission electron microscope observation on a cross-section perpendicular to the substrate plane.

2. The oxide superconductor according to claim 1, wherein a thickness of the film is not more than 10 μm.

3. An oxide superconductor formed as a film on a substrate, comprising a main component represented by $LaBa_2Cu_3O_{7-x}$, and fluorine at a molar ratio of $10^{-2}$ to $10^{-6}$ with respect to copper, wherein the film has a structure in which grain boundaries having a bonding angle of about 0.2° to 1° are regularly arranged every 5 to 50 nm based on transmission electron microscope observation on a plane parallel to the substrate and apart by 50 nm from the substrate in a direction perpendicular to the substrate.

4. The oxide superconductor formed as a film according to claim 3, wherein the film thereof has a film thickness of at most 10 μm.

* * * * *